United States Patent
Tezuka

(10) Patent No.: US 9,786,793 B2
(45) Date of Patent: Oct. 10, 2017

(54) SEMICONDUCTOR DEVICE COMPRISING OXIDE SEMICONDUCTOR LAYER INCLUDING REGIONS WITH DIFFERENT CONCENTRATIONS OF RESISTANCE-REDUCING ELEMENTS

(71) Applicant: SEMICONDUCTOR ENERGY LABORATORY CO., LTD., Atsugi-shi, Kanagawa-ken (JP)

(72) Inventor: Sachiaki Tezuka, Kanagawa (JP)

(73) Assignee: Semiconductor Energy Laboratory Co., LTD., Kanagawa-ken (JP)

( * ) Notice: Subject to any disclaimer, the term of this patent is extended or adjusted under 35 U.S.C. 154(b) by 0 days.

(21) Appl. No.: 13/832,654

(22) Filed: Mar. 15, 2013

(65) Prior Publication Data
US 2013/0256656 A1    Oct. 3, 2013

(30) Foreign Application Priority Data

Mar. 29, 2012   (JP) .................. 2012-075612
Apr. 12, 2012   (JP) .................. 2012-090711

(51) Int. Cl.
*H01L 29/78*    (2006.01)
*H01L 21/16*    (2006.01)
(Continued)

(52) U.S. Cl.
CPC .... *H01L 29/78693* (2013.01); *H01L 29/7869* (2013.01)

(58) Field of Classification Search
CPC ..... H01L 29/7869; H01L 21/16; H01L 21/00; H01L 29/24; H01L 21/479
(Continued)

(56) References Cited

U.S. PATENT DOCUMENTS

| 5,731,856 A | 3/1998 | Kim et al. |
| 5,744,864 A | 4/1998 | Cillessen et al. |

(Continued)

FOREIGN PATENT DOCUMENTS

| EP | 1005093 A | 5/2000 |
| EP | 1737044 A | 12/2006 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Allen Parker
*Assistant Examiner* — Didarul Mazumder
(74) *Attorney, Agent, or Firm* — Nixon Peabody LLP; Jeffrey L. Costellia

(57) ABSTRACT

To increase the on-state current of a transistor whose channel is formed in an oxide semiconductor layer. To provide a transistor where a resistance-reducing element is introduced into a region of an oxide semiconductor layer which overlaps with part of a source or drain or part of a gate. For example, the thickness of a region of a conductive layer serving as a source or drain or a gate (at least part of a region overlapping with an oxide semiconductor layer) is made smaller than that of the other region of the conductive layer. A resistance-reducing element is introduced into the oxide semiconductor layer through the conductive layer thinned partly, thereby obtaining the oxide semiconductor layer where the resistance-reducing element is introduced into the region overlapping with part of the source or drain or part of the gate. Thus, the on-state current of the transistor can be increased.

11 Claims, 14 Drawing Sheets

(51) Int. Cl.
  *H01L 21/00* (2006.01)
  *H01L 29/24* (2006.01)
  *H01L 21/47* (2006.01)
  *H01L 29/786* (2006.01)

(58) Field of Classification Search
  USPC .......................................................... 257/43
  See application file for complete search history.

(56) References Cited

U.S. PATENT DOCUMENTS

| | | |
|---|---|---|
| 6,294,274 B1 | 9/2001 | Kawazoe et al. |
| 6,365,917 B1 | 4/2002 | Yamazaki |
| 6,563,174 B2 | 5/2003 | Kawasaki et al. |
| 6,727,522 B1 | 4/2004 | Kawasaki et al. |
| 6,949,767 B2 | 9/2005 | Yamazaki |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,564,059 B2 | 7/2009 | Yamazaki |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,804,091 B2 | 9/2010 | Takechi et al. |
| 8,232,124 B2 | 7/2012 | Takechi et al. |
| 8,237,166 B2 | 8/2012 | Kumomi et al. |
| 8,481,377 B2 | 7/2013 | Akimoto et al. |
| 9,240,488 B2 | 1/2016 | Yamazaki et al. |
| 9,378,980 B2 | 6/2016 | Yamazaki et al. |
| 2001/0046027 A1 | 11/2001 | Tai et al. |
| 2001/0049197 A1* | 12/2001 | Yamazaki ......... H01L 29/42384 438/689 |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0110016 A1* | 5/2005 | Yamazaki ....................... 257/66 |
| 2005/0199959 A1 | 9/2005 | Chiang et al. |
| 2005/0250308 A1* | 11/2005 | Yamaguchi ....... H01L 29/78621 438/618 |
| 2006/0035452 A1 | 2/2006 | Carcia et al. |
| 2006/0043377 A1 | 3/2006 | Hoffman et al. |
| 2006/0051906 A1* | 3/2006 | Yamazaki ......... H01L 21/28114 438/149 |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2009/0315085 A1 | 12/2009 | Yamazaki |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0089975 A1* | 4/2011 | Yamazaki ........... H01L 27/1225 326/102 |
| 2011/0204362 A1* | 8/2011 | Akimoto et al. ................ 257/52 |
| 2012/0003797 A1* | 1/2012 | Sasagawa et al. ............ 438/159 |
| 2012/0074418 A1 | 3/2012 | Yamazaki |
| 2012/0132904 A1* | 5/2012 | Yamazaki ...................... 257/43 |
| 2012/0171813 A1* | 7/2012 | Akimoto ...................... 438/104 |
| 2012/0187396 A1* | 7/2012 | Yamazaki ......... H01L 29/66742 257/43 |
| 2012/0193625 A1 | 8/2012 | Sasagawa et al. |
| 2012/0193628 A1* | 8/2012 | Sasaki ................ H01L 29/7869 257/59 |
| 2013/0092944 A1 | 4/2013 | Honda et al. |
| 2013/0126859 A1* | 5/2013 | Yeh et al. ....................... 257/43 |
| 2016/0293767 A1 | 10/2016 | Yamazaki et al. |

FOREIGN PATENT DOCUMENTS

| | | |
|---|---|---|
| EP | 2226847 A | 9/2010 |
| EP | 2259316 A | 12/2010 |
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 05-251705 | 9/1993 |
| JP | 06-333948 A | 12/1994 |
| JP | 08-264794 | 10/1996 |
| JP | 11-505377 | 5/1999 |

(56) References Cited

FOREIGN PATENT DOCUMENTS

| | | |
|---|---|---|
| JP | 2000-044236 | 2/2000 |
| JP | 2000-150900 | 5/2000 |
| JP | 2000-223714 A | 8/2000 |
| JP | 2002-076356 | 3/2002 |
| JP | 2002-289859 | 10/2002 |
| JP | 2003-086000 | 3/2003 |
| JP | 2003-086808 | 3/2003 |
| JP | 2004-103957 | 4/2004 |
| JP | 2004-273614 | 9/2004 |
| JP | 2004-273732 | 9/2004 |
| JP | 2006-165528 | 6/2006 |
| JP | 2007-109733 A | 4/2007 |
| JP | 2007-220816 A | 8/2007 |
| JP | 2008-040343 A | 2/2008 |
| JP | 2011-146694 A | 7/2011 |
| JP | 2011-192974 A | 9/2011 |
| WO | WO-2004/114391 | 12/2004 |
| WO | WO-2011/074407 | 6/2011 |
| WO | WO-2011/102217 | 8/2011 |

OTHER PUBLICATIONS

Dembo.H et al , "RFCPUS on Glass and Plastic Substrates Fabricated by TFT Transfer Technology,", IEDM 05. Technical Digest of International Electron Devices Meeting, Dec. 5, 2005, pp. 1067-1069.

Ikeda T et al., "Full-Functional System Liquid Crystal Display Using Cg-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Eng. Hayashi.R et at, "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—$ZnO$ system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)3$, and $Ga_2O_3(ZnO)m$ (m=7, 8, 9, and 16) in the $In_2O_3$—$ZnGa_2O_4$—$ZnO$ system,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al.. "Crystallization and Reduction of Sol-Gel-Derived Zinc Oxide Films by.Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn-Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fund T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Backplane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985

Sakata.J et al., "Development of 4.0-In. Amoled Display With Driver Circuit Using Amorphous In—Ga—Zn-Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

(56) References Cited

OTHER PUBLICATIONS

Park.S et al., "Challenge to Future Displays: Transparent AM-OLED Driven by Peald Grown Zno TFT,", IMID '07 Digest, 2007, pp. 1249-1252.

Godo.H et al., "Temperature Dependence of Characteristics and Electronic Structure for Amorphous In—Ga—Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn-Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn-Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn-Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1: Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized.Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters) , 2008, vol. 92, pp. 072104-1-072104-3.

Hsieh H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosphical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

\* cited by examiner

SEMICONDUCTOR DEVICE COMPRISING OXIDE SEMICONDUCTOR LAYER INCLUDING REGIONS WITH DIFFERENT CONCENTRATIONS OF RESISTANCE-REDUCING ELEMENTS

BACKGROUND OF THE INVENTION

1. Field of the Invention

The present invention relates to a transistor and a method for manufacturing the transistor. In particular, the present invention relates to a transistor in which a channel is formed in an oxide semiconductor layer and a method for manufacturing the transistor. Further, the present invention relates to a semiconductor device including the transistor and a method for manufacturing the semiconductor device.

Note that "semiconductor device" in this specification indicates all devices that can operate by utilizing semiconductor characteristics. For example, electro-optical devices, semiconductor circuits, and electronic devices are all included in the category of the semiconductor device.

2. Description of the Related Art

A technique by which transistors are formed using semiconductor thin films over a substrate having an insulating surface is known. The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer includes an amorphous oxide including indium (In), gallium (Ga), and zinc (Zn) is disclosed (see Patent Document 1).

REFERENCE

Patent Document

[Patent Document 1] Japanese Published Patent Application No. 2006-165528

SUMMARY OF THE INVENTION

An object of one embodiment of the present invention is to increase the on-state current of a transistor in which a channel is formed in an oxide semiconductor layer.

According to one embodiment of the present invention, a transistor in which a resistance-reducing element is introduced into a region of an oxide semiconductor layer which overlaps with a part of a source or a drain or a part of a gate is provided. For example, the thickness of a region of a conductive layer serving as a source or a drain or serving as a gate (the thickness of at least a part of a region overlapping with an oxide semiconductor layer) is made smaller than the thickness of the other region of the conductive layer. Then, treatment for doping the oxide semiconductor layer with a resistance-reducing element is performed through the conductive layer which is partly thinned. Thus, it is possible to obtain the oxide semiconductor layer in which the resistance-reducing element is introduced into the region overlapping with a part of the source or the drain or a part of the gate.

In the transistor which is one embodiment of the present invention, the resistance-reducing element is introduced into the region of the oxide semiconductor layer which overlaps with the source or the drain. Thus, the contact resistance between the oxide semiconductor layer, and the source and the drain can be reduced. As a result, the on-state current of the transistor can be increased.

DETAILED DESCRIPTION OF THE INVENTION

Embodiments of the present invention will be described in detail below. Note that the present invention is not limited to the description below, and a variety of changes can be made without departing from the spirit and scope of the present invention. Therefore, the present invention should not be construed as being limited to the description below.

1. Embodiment 1

In this embodiment, a transistor according to one embodiment of the present invention and a method for manufacturing the transistor will be described with reference to FIGS. 1A to 1C, FIGS. 2A to 2E, FIGS. 3A to 3C, FIGS. 4A to 4E, and FIGS. 5A to 5E.

1-1. Example of Structure of Transistor

Figure 1A:
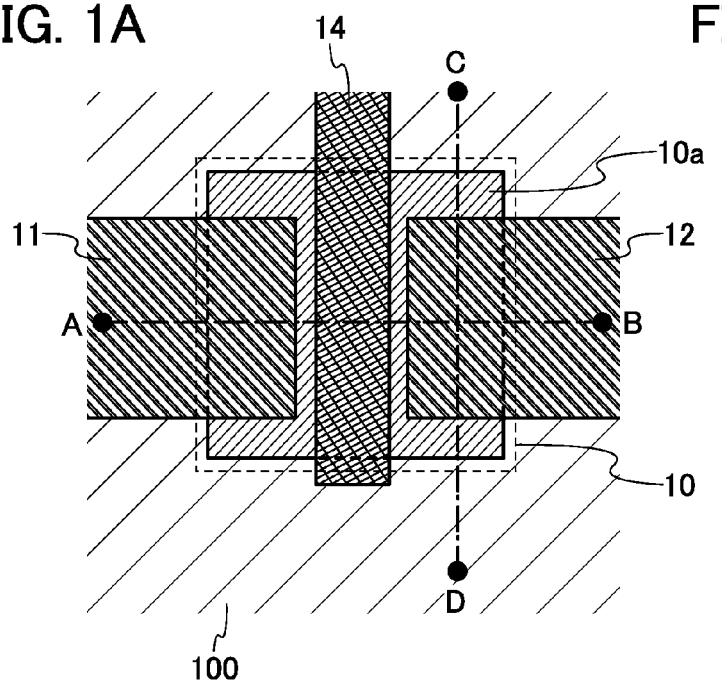
FIG. 1A is a plan view of a transistor according to one embodiment of the present invention.
Figure 1C:
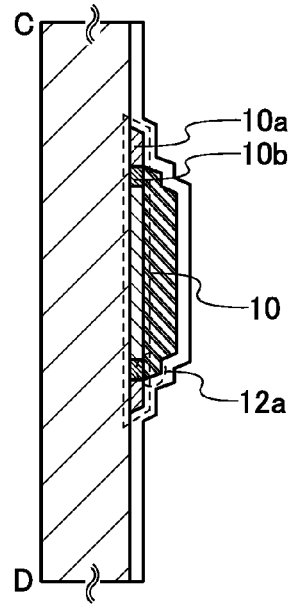
FIGS. 1B and 1C are cross-sectional views of the transistor.
Figure 1B:
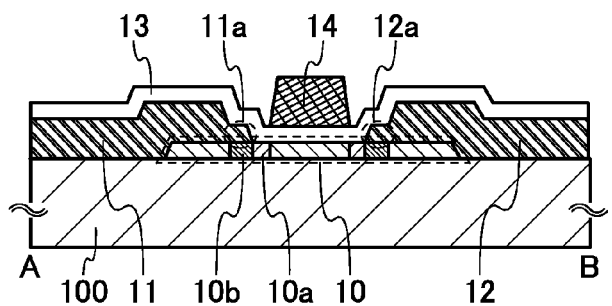

FIGS. 1A to 1C illustrate an example of a structure of a transistor. Specifically, FIG. 1A is a plan view of the transistor, FIG. 1B is a cross-sectional view taken along line A-B in FIG. 1A, and FIG. 1C is a cross-sectional view taken along line C-D in FIG. 1A.

The transistor shown in FIGS. 1A to 1C includes an oxide semiconductor layer 10 which is provided over a substrate 100, a conductive layer 11 and a conductive layer 12 which are provided over the oxide semiconductor layer 10, an insulating layer 13 which is provided over the oxide semiconductor layer 10 and the conductive layers 11 and 12, and a conductive layer 14 which is provided over the insulating layer 13. Note that the transistor shown in FIGS. 1A to 1C is a transistor in which the conductive layer 11 and the conductive layer 12 serve as a source and a drain, the insulating layer 13 serves as a gate insulating layer, and the conductive layer 14 serves as a gate.

The conductive layer 14 is provided in a region which overlaps with the oxide semiconductor layer 10 and does not overlap with the conductive layer 11 or the conductive layer 12.

The conductive layer 11 and the conductive layer 12 have a plurality of portions with different film thicknesses. Specifically, the film thickness of an edge portion 11a of the conductive layer 11 which lies in a region overlapping with the oxide semiconductor layer 10 is smaller than the film thickness of the other region of the conductive layer 11, and the film thickness of an edge portion 12a of the conductive layer 12 which lies in a region overlapping with the oxide semiconductor layer 10 is smaller than the film thickness of the other region of the conductive layer 12.

The oxide semiconductor layer 10 includes a plurality of regions with different concentrations of the resistance-reducing element. Specifically, the concentration of the resistance-reducing element in a region 10a which does not overlap with the conductive layer 11, the conductive layer 12, or the conductive layer 14 is higher than the concentration of the resistance-reducing element in a region 10b which overlaps with the edge portion 11a of the conductive layer 11 and the edge portion 12a of the conductive layer 12. In addition, the concentration of the resistance-reducing element in the region 10b is higher than the concentration of the resistance-reducing element in a region which overlaps with the conductive layer 14 and regions which overlap with the conductive layer 11 (excluding the edge portion 11a) and the conductive layer 12 (excluding the edge portion 12a).

Note that in this specification, the resistance-reducing element refers to any element which reduces the resistance of an oxide semiconductor layer by being introduced into the oxide semiconductor layer. Examples of the resistance-reducing element include carbon (C), phosphorus (P), arsenic (As), antimony (Sb), boron (B), aluminum (Al), nitrogen (N), argon (Ar), helium (He), neon (Ne), indium (In), fluorine (F), chlorine (Cl), titanium (Ti), and zinc (Zn).

In the transistor shown in FIGS. 1A to 1C, the concentration of the resistance-reducing element in the region 10b of the oxide semiconductor layer 10 is higher than the concentration of the resistance-reducing element in the regions of the oxide semiconductor layer 10 which overlap with the conductive layer 11 (excluding the edge portion 11a) and the conductive layer 12 (excluding the edge portion 12a). Thus, the contact resistance between the oxide semiconductor layer 10 and each of the conductive layers 11 and 12 can be reduced. As a result, the on-state current of the transistor can be increased.

Note that in the transistor shown in FIGS. 1A to 1C, the taper angle in each of the edge portion 11a and the edge portion 12a is preferably greater than or equal to 30° and less than or equal to 60°. This is for prevention of short circuit of the transistor by improving coverage of the edge portion 11a and the edge portion 12a with the insulating layer 13. The taper angle here refers to an angle formed by the side surface of a layer which has a tapered shape and the bottom surface of the layer.

1-1-1. Specific Example of Oxide Semiconductor Layer 10

<(1) Material>

A film containing at least indium can be used as the oxide semiconductor layer 10. In particular, a film containing indium and zinc is preferably used. As a stabilizer for reducing variations in electrical characteristics of the transistor, a film containing gallium in addition to indium and zinc is preferably used.

Alternatively, a film which contains, as a stabilizer, one or more of tin, hafnium, aluminum, zirconium, and lanthanoid such as lanthanum, cerium, praseodymium, neodymium, samarium, europium, gadolinium, terbium, dysprosium, holmium, erbium, thulium, ytterbium, or lutetium can be used as the oxide semiconductor layer 10.

As the oxide semiconductor layer 10, for example, a film of any of the following oxides can be used: indium oxide; a two-component metal oxide such as an In—Zn-based oxide, an In—Mg-based oxide, or an In—Ga-based oxide; a three-component metal oxide such as an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In, Ga, and Zn. The In—Ga—Zn-based oxide may contain a metal element other than the In, Ga, and Zn.

Nitrogen may be substituted for part of constituent oxygen of the oxide semiconductor layer 10.

<(2) Crystal Structure>

For the oxide semiconductor layer 10, a film having a single crystal state, a polycrystalline (also referred to as polycrystal) state, an amorphous state, or the like can be used. In addition, a CAAC-OS (c-axis aligned crystalline oxide semiconductor) film can be used for the oxide semiconductor layer 10. The CAAC-OS film is described in detail below.

Each of crystals included in the CAAC-OS film, in many cases, fits inside a cube whose one side is less than 100 nm. In an observation image obtained with a transmission electron microscope (TEM), a boundary between crystals in the CAAC-OS film is not clear. Furthermore, with the TEM, a grain boundary in the CAAC-OS film is not found. Thus, in the CAAC-OS film, a reduction in electron mobility, due to the grain boundary, is suppressed.

In each of crystals included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that the directions of the a-axis and the b-axis of one crystal may be different from those of another crystal region. In this specification, a simple term "perpendicular" includes a range from 85° to 95°. In addition, a simple term "parallel" includes a range from −5° to 5°.

In the CAAC-OS film, distribution of crystals in a film thickness direction is not necessarily uniform. For example, in the case where crystal growth occurs from the surface side of an oxide semiconductor film in a formation process of the CAAC-OS film, the proportion of crystals in the vicinity of a surface of the CAAC-OS film is higher than that in the vicinity of the surface where the CAAC-OS film is formed in some cases.

Since the c-axes of the crystals included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal region is the direction parallel to a normal vector of the surface where the CAAC-OS film is formed or a normal vector of the surface of the CAAC-OS film. The crystal region is formed by deposition or by performing treatment for crystallization such as heat treatment after deposition.

With the use of the CAAC-OS film in a transistor, change in electrical characteristics of the transistor due to irradiation with visible light or ultraviolet light is small. Thus, the transistor has high reliability.

<(3) Layer Structure>

For the oxide semiconductor layer 10, not only a single-layer oxide semiconductor film but also a layer formed of a stack having plural kinds of oxide semiconductor films may be used. For example, a layer including at least two of an amorphous oxide semiconductor film, a polycrystalline oxide semiconductor film, and a CAAC-OS film can be used for the oxide semiconductor layer 10.

Alternatively, a layer formed of a stack of oxide semiconductor films having different compositions can be used for the oxide semiconductor layer 10. Specifically, a layer including a first oxide semiconductor film (also referred to as an upper layer) which has a surface in contact with the insulating layer 13 and a second oxide semiconductor film (also referred to as a lower layer) which includes a surface opposite to the surface and has a different composition from the first oxide semiconductor film can be used for the oxide semiconductor layer 10. Note that in this case, a region in which a channel is formed is largely included in the upper layer. This is because the upper layer is closer to the conductive layer 14 serving as a gate than the lower layer is.

Here, in the case where the upper layer and the lower layer both contain indium, gallium, and zinc, concentrations are preferably set such that the indium concentration in the upper layer is higher than that in the lower layer and the gallium concentration in the lower layer is higher than that in the upper layer, or/and such that the indium concentration in the upper layer is higher than the gallium concentration in the upper layer and the gallium concentration in the lower layer is higher than the indium concentration in the lower layer.

Thus, it is possible to improve mobility of a transistor including the oxide semiconductor layer 10 and suppress formation of a parasitic channel in the transistor. Specifically, a high indium concentration of the upper layer can cause an improvement in the mobility of the transistor. This is because, in an oxide semiconductor, the s orbital of heavy metal mainly contributes to carrier transfer, and when the percentage of the In content in the oxide semiconductor is increased, overlaps of the s orbitals of In atoms are increased. In addition, a high gallium concentration of the lower layer leads to inhibition of release of oxygen, which can inhibit formation of a parasitic channel in the lower layer. This is because, in Ga, the formation energy of oxygen vacancies is larger and thus oxygen vacancies are less likely to occur, than in In.

1-1-2. Specific Example of Conductive Layer 11 and Conductive Layer 12

For the conductive layer 11 and the conductive layer 12, a film containing an element selected from aluminum, copper, titanium, tantalum, tungsten, molybdenum, chromium, neodymium, and scandium, a film of an alloy containing any of these elements, a film of a nitride containing any of these elements, or the like can be used. Alternatively, each of the conductive layer 11 and the conductive layer 12 can be formed with a stack of these films.

1-1-3. Specific Example of Insulating Layer 13

For the insulating layer 13, an inorganic insulating material film such as a silicon oxide film, a silicon nitride film, a silicon oxynitride film, a silicon nitride oxide film, an aluminum oxide film, an aluminum oxynitride film, or a gallium oxide film can be used. Alternatively, a stack of layers of these materials can also be used. The aluminum oxide film has a high shielding (blocking) effect of preventing penetration of both oxygen and impurities such as hydrogen. Therefore, when the layer including an aluminum oxide film is used as the insulating layer 13, it is possible to prevent release of oxygen from the oxide semiconductor layer 10 and entry of an impurity such as hydrogen to the oxide semiconductor layer 10.

The insulating layer 13 can be formed using a film including a hafnium oxide film, an yttrium oxide film, a hafnium silicate (HfSi$_x$O$_y$ (x>0, y>0)) film, a hafnium silicate film to which nitrogen is added, a hafnium aluminate (HfAl$_x$O$_y$ (x>0, y>0)) film, a lanthanum oxide film (i.e., a film formed of what is called a high-k material), or the like. By using such a film, gate leakage current can be reduced.

1-1-4. Specific Example of Conductive Layer 14

As the conductive layer 14, a film containing an element selected from aluminum, copper, titanium, tantalum, tungsten, molybdenum, chromium, neodymium, and scandium or a film of an alloy containing any of these elements as its component can be used. Alternatively, a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film can be used for the conductive layer 14. Such a nitride film has a work function of higher than or equal to 5 eV (electron volts), preferably higher than or equal to 5.5 eV (electron volts), which enables the threshold voltage of the transistor to be positive when such a nitride film is used as the gate, so that what is called a normally-off switching element can be achieved. Alternatively, the conductive layer 14 can be formed with a stack of these films.

1-2. Example of Process for Manufacturing Transistor

FIGS. 2A to 2E are cross-sectional views at respective stages of a process for manufacturing the transistor shown in FIGS. 1A to 1C. Note that FIGS. 2A to 2E are cross-sectional views taken along line A-B in FIG. 1A.

<1-2-1. Formation of Oxide Semiconductor Layer 10>

First, an oxide semiconductor layer is formed over the substrate 100, and the oxide semiconductor layer is processed, whereby the oxide semiconductor layer 10 is formed.

Note that there is no particular limitation on a substrate that can be used as the substrate 100 as long as it has at least heat resistance to withstand later heat treatment. For example, a substrate such as a glass substrate, a ceramic substrate, a quartz substrate, or a sapphire substrate can be used. As long as the substrate 100 has an insulating surface, a single crystal semiconductor substrate or a polycrystalline semiconductor substrate of silicon, silicon carbide, or the like; a compound semiconductor substrate of silicon germanium or the like; an SOI substrate; or the like can be used as the substrate 100, and a semiconductor element can be provided over the substrate. In addition, a base film may be provided over the substrate 100.

As a method for forming the oxide semiconductor layer, it is preferable to use a method such that hydrogen, water, a hydroxyl group, hydride, or the like is less likely to enter the oxide semiconductor layer. For example, as such a formation method, a sputtering method or the like can be used.

When the oxide semiconductor layer is formed by a sputtering method, the formation can be performed under a rare gas (typically argon) atmosphere, an oxygen atmosphere, a mixed atmosphere of a rare gas and oxygen, or the like. An atmosphere of a high-purity gas from which an impurity such as hydrogen, water, a hydroxyl group, or hydride is sufficiently removed is preferable, in order to prevent hydrogen, water, a hydroxyl group, hydride, or the like from entering the oxide semiconductor layer.

For example, the oxide semiconductor layer can be formed by the following steps.

First, the substrate is held in a deposition chamber which is kept under reduced pressure, and then is heated so that the substrate temperature reaches a temperature higher than 200° C. and lower than or equal to 500° C., preferably higher than 300° C. and lower than or equal to 500° C., further preferably higher than or equal to 350° C. and lower than or equal to 450° C.

Then, a high-purity gas from which an impurity such as hydrogen, water, a hydroxyl group, or hydride is sufficiently removed is introduced while moisture remaining in the deposition chamber is removed, and the oxide semiconductor layer is formed over the substrate 100. To remove moisture remaining in the deposition chamber, an entrapment vacuum pump such as a cryopump, an ion pump, or a titanium sublimation pump is desirably used. Further, an evacuation unit may be a turbo pump provided with a cold trap. In the deposition chamber which is evacuated with the cryopump, for example, impurities such as hydrogen, water, a hydroxyl group, or hydride (preferably, also a compound containing a carbon atom) or the like are removed, whereby the concentration of impurities such as hydrogen, water, a hydroxyl group, or hydride in the oxide semiconductor layer formed in the deposition chamber can be reduced.

In the case where the substrate temperature is low (e.g., 100° C. or lower) during deposition, a substance including a hydrogen atom might enter the oxide semiconductor layer; thus, it is preferable that the substrate 100 be heated at the temperature in the above range. When the oxide semiconductor layer is formed with the substrate 100 heated at the temperature in the above range, since the substrate temperature is high, hydrogen bonds are cut by heat and are less likely to be taken into the oxide semiconductor layer. Therefore, by forming the oxide semiconductor layer with the substrate 100 heated at the temperature in the above range, the concentration of impurities such as hydrogen, water, a hydroxyl group, or hydride in the oxide semiconductor layer can be sufficiently reduced. Moreover, damage due to sputtering can be reduced.

Note that before the oxide semiconductor layer is formed by a sputtering method, powdery substances (also referred to as particles or dust) attached on a formation surface of the oxide semiconductor layer are preferably removed by reverse sputtering in which an argon gas is introduced and plasma is generated. The reverse sputtering refers to a method in which a voltage is applied to a substrate side to generate plasma in the vicinity of the substrate to modify a surface. Note that instead of argon, a gas of nitrogen, helium, oxygen, or the like may be used.

As a method for processing the oxide semiconductor layer formed, the following method is given: after a mask with a desired shape is formed over the oxide semiconductor layer, the oxide semiconductor layer is etched.

The mask may be formed by a method such as photolithography or an ink-jet method. For the etching of the oxide semiconductor layer, either wet etching or dry etching may be employed. It is needless to say that both of them may be employed in combination.

Further, it is preferable to perform heat treatment (first heat treatment) on the oxide semiconductor layer 10 obtained by processing (or the oxide semiconductor layer which has not been processed). By the heat treatment, the concentration of a hydrogen atom in the oxide semiconductor layer 10 can be reduced. The heat treatment is performed under an inert gas atmosphere at higher than or equal to 250° C. and lower than or equal to 700° C., preferably higher than or equal to 450° C. and lower than or equal to 600° C. or lower than a strain point of the substrate. The inert gas atmosphere is preferably an atmosphere which contains nitrogen or a rare gas (e.g., helium, neon, or argon) as its main component and does not contain water, hydrogen, or the like. For example, the purity of nitrogen or a rare gas such as helium, neon, or argon introduced into a heat treatment apparatus is greater than or equal to 6 N (99.9999%), preferably greater than or equal to 7 N (99.99999%) (that is, the concentration of the impurities is less than or equal to 1 ppm, preferably less than or equal to 0.1 ppm).

An oxide semiconductor layer in which impurities are reduced by performing the heat treatment is formed, whereby, a transistor having extremely excellent characteristics can be realized.

The above-described heat treatment has an effect of removing hydrogen, water, and the like and thus can be referred to as dehydration treatment, dehydrogenation treatment, or the like. Such dehydration treatment or dehydrogenation treatment may be performed more than once.

<1-2-2. Formation of Conductive Layer 11 and Conductive Layer 12>

Figure 2A:
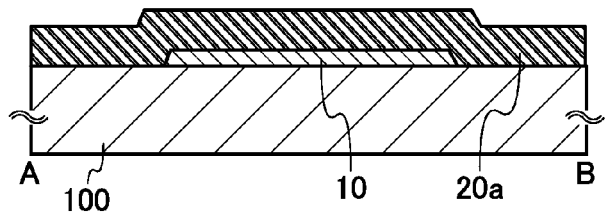
FIGS. 2A to 2E are cross-sectional views at respective stages of a process for manufacturing a transistor according to one embodiment of the present invention.

Next, a conductive layer 20a is formed over the oxide semiconductor layer 10 (see FIG. 2A).

A PVD method, a CVD method, or the like can be used as the method for forming the conductive layer 20a.

Figure 2B:
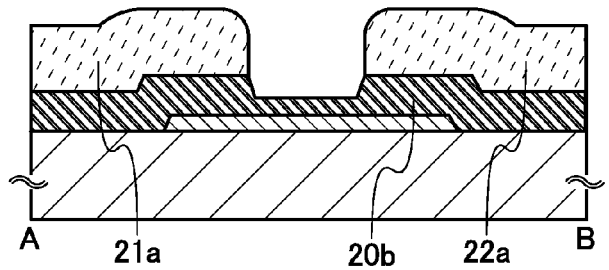

Then, a resist mask 21a and a resist mask 22a are formed over the conductive layer 20a (see FIG. 2B). For example, after the conductive layer 20a is coated with a resist, a photomask is set in a light-exposure apparatus and light is projected on the resist, so that the resist is exposed to light. Then, the resist is developed, so that the resist mask 21a and the resist mask 22a can be formed.

In order to form a channel length of the transistor minutely, light with a wavelength less than or equal to 365 nm is preferably used as a light source of the light-exposure apparatus. For example, light having a spectrum of a high pressure mercury lamp such as the i-line (with a wavelength of 365 nm), or light with a wavelength in the range from an ultraviolet light region to a visible light region, such as KrF laser light (with a wavelength of 248 nm) or ArF laser light (with a wavelength of 193 nm), is preferably used.

After the resist mask 21a and the resist mask 22a are formed, the conductive layer 20a is subjected to half etching with the use of the masks, whereby a conductive layer 20b having a recessed portion is formed. Note that the half etching refers to treatment in which etching is stopped so that the conductive layer is left to cover the substrate. That is, the half etching means treatment for reducing the film thickness of the conductive layer (thinning the conductive layer) but does not mean treatment for completely removing the conductive layer.

Figure 2C:
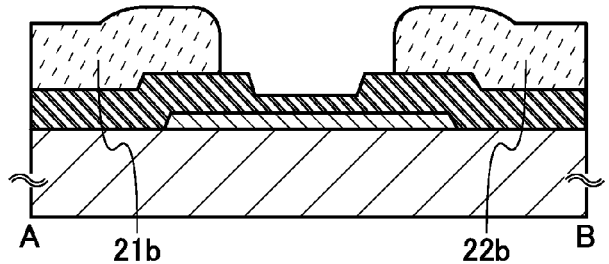

Then, the resist mask 21a and the resist mask 22a are made to recede (reduce), whereby a resist mask 21b and a resist mask 22b are formed (see FIG. 2C). In order to make the resist masks recede (reduce), ashing using oxygen plasma or the like may be performed. By making the resist masks recede (reduce), a part of the conductive layer 20b is exposed.

Figure 2D:
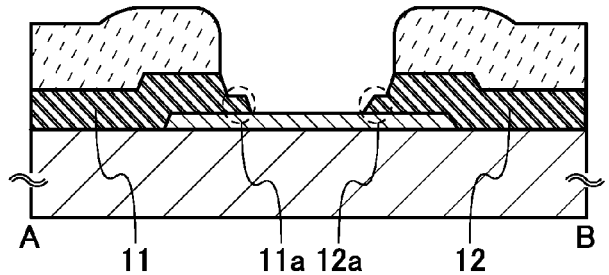

Next, the conductive layer 20b is etched with the use of the resist mask 21b and the resist mask 22b, whereby the conductive layer 11 and the conductive layer 12 are formed (see FIG. 2D). Because the exposed part of the conductive layer 20b which is not covered with the resist mask 21b and the resist mask 22b is etched, the conductive layer 11 having the edge portion 11a with a small thickness and the conductive layer 12 having the edge portion 12a with a small thickness are obtained.

<1-2-3. Formation of Insulating Layer 13>

Next, the insulating layer 13 is formed over the oxide semiconductor layer 10 and the conductive layers 11 and 12.

A PVD method, a CVD method, or the like can be used as the method for forming the insulating layer 13.

After formation of the insulating layer 13, second heat treatment is preferably performed under an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed at 250° C. under a nitrogen atmosphere for 1 hour. The second heat treatment can reduce variation in electrical characteristics of the transistor. Moreover, in the case where the insulating layer 13 includes oxygen, oxygen can be supplied to the oxide semiconductor layer 10 to compensate oxygen defects in the oxide semiconductor layer 10, whereby an i-type (intrinsic) or substantially i-type oxide semiconductor layer can be formed.

Note that the timing of the second heat treatment is not particularly limited thereto. For example, the second heat treatment may be performed after formation of the conductive layer 14. Alternatively, the second treatment may also serve as the first heat treatment By performing the first heat treatment and the second heat treatment as described above, the oxide semiconductor layer 10 can be highly purified so as to include the substance including a hydrogen atom as few as possible.

<1-2-4. Formation of Conductive Layer 14>

Next, a conductive layer is formed, and the conductive layer is processed, whereby the conductive layer 14 is formed. Note that as the formation method and the processing method, methods similar to the formation method and the processing method of the conductive layer 20a can be used.

<1-2-5. Introduction of Resistance-Reducing Element>

Figure 2E:
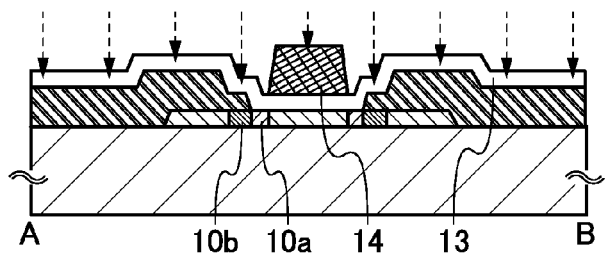

Next, the resistance-reducing element is introduced into the oxide semiconductor layer 10 (see FIG. 2E).

The resistance-reducing element can be introduced by an ion doping method or an ion implantation method. The introduction is performed on the oxide semiconductor layer 10 through the conductive layer 11, the conductive layer 12, the conductive layer 14, and the insulating layer 13. Thus, the concentration of the resistance-reducing element introduced into each region of the oxide semiconductor layer 10 can be controlled depending on whether or not the region overlaps with the conductive layer, for example. Here, in the conductive layer 11 and the conductive layer 12, the film thickness of the edge portion 11a and the film thickness of the edge portion 12a are smaller than those of other regions. Therefore, in the oxide semiconductor layer 10, the concentration of the resistance-reducing element in the region 10b overlapping with the edge portion 11a of the conductive layer 11 or the edge portion 12a of the conductive layer 12 is higher than the concentration of the resistance-reducing element in a region overlapping with the conductive layer 11 (excluding the edge portion 11a) or the conductive layer 12 (excluding the edge portion 12a). Further, the concentration of the resistance-reducing element in the region 10a which does not overlap with the conductive layer 11, the conductive layer 12, or the conductive layer 14 is higher than the concentration of the resistance-reducing element in the region 10b.

By the above-described process, the transistor shown in FIGS. 1A to 1C is completed.

1-3. Modification Examples of Transistor and Manufacturing Process Thereof

The transistor shown in FIGS. 1A to 1C is one embodiment of the present invention. The present invention also includes a transistor having a structure different from that of the transistor shown in FIGS. 1A to 1C and a process for manufacturing the transistor which is different from that for manufacturing the transistor shown in FIGS. 2A to 2E.

1-3-1. Modification Example 1

Figure 3A:
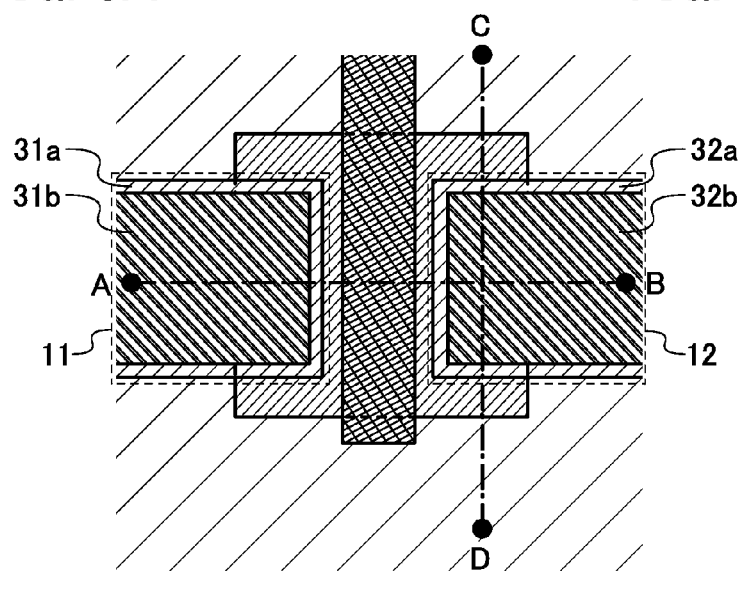
FIG. 3A is a plan view of a transistor according to one embodiment of the present invention.
Figure 3C:
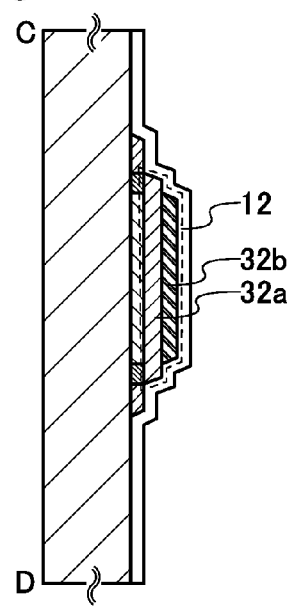
FIGS. 3B and 3C are cross-sectional views of the transistor.
Figure 3B:
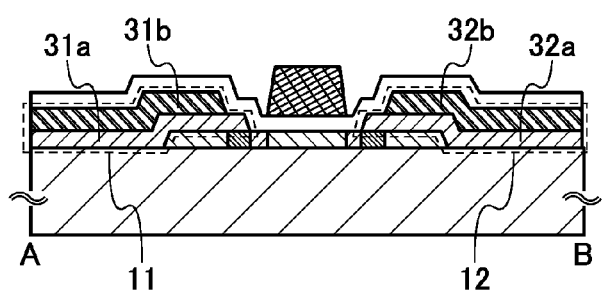

FIGS. 3A to 3C illustrate a transistor which is one embodiment of the present invention. Note that the transistor shown in FIGS. 3A to 3C is different from the transistor shown in FIGS. 1A to 1C in the structures of the conductive layer 11 and the conductive layer 12; however, the structures of other components in the transistor shown in FIGS. 3A to 3C are similar to those in the transistor shown in FIGS. 1A to 1C. Specifically, in the transistor shown in FIGS. 3A to 3C, the conductive layer 11 has a stacked-layer structure of a conductive layer 31a and a conductive layer 31b, and the conductive layer 12 has a stacked-layer structure of a conductive layer 32a and a conductive layer 32b. Note that the conductive layer 31b does not lie in a region overlapping with an edge portion of the conductive layer 31a, and the conductive layer 32b does not lie in a region overlapping with an edge portion of the conductive layer 32a.

The transistor having the structure shown in FIGS. 3A to 3C has an advantageous effect similar to that of the transistor shown in FIGS. 1A to 1C. That is, the concentration of the resistance-reducing element in a region of the oxide semiconductor layer which overlaps with the edge portion of the conductive layer 31a and the edge portion of the conductive layer 32a can be higher than the concentration of the resistance-reducing element in a region of the oxide semiconductor layer which overlaps with the conductive layer 31b and the conductive layer 32b. Thus, the contact resistance between the oxide semiconductor layer and each of the conductive layers 11 and 12 can be reduced. As a result, the on-state current of the transistor can be increased.

Note that as a process for manufacturing the transistor shown in FIGS. 3A to 3C, a manufacturing process similar to the manufacturing process of the transistor which is described with reference to FIGS. 2A to 2E can be used. In addition, in the transistor shown in FIGS. 3A to 3C, the film thickness of the edge portion of the conductive layer 11 is controlled more easily than that in the transistor shown in FIGS. 1A to 1C. Specifically, in the transistor shown in FIGS. 3A to 3C, the film thickness of the edge portion of the conductive layer 11 can be controlled by selecting an etching condition in which the etching rate of a film which is to be the conductive layers 31b and 32b is higher than the etching rate of a film which is to be the conductive layers 31a and 32a and by adjusting the film thickness of each of the conductive layers 31a and 32a at the time of formation.

1-3-2. Modification Example 2

FIGS. 4A to 4E illustrate an example of a process for manufacturing the transistor which is one embodiment of the present invention. Note that FIGS. 4A to 4E are cross-sectional views at respective stages of a process for manufacturing the transistor.

Figure 4A:
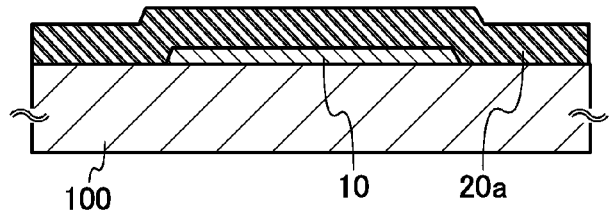
FIGS. 4A to 4E are cross-sectional views at respective stages of a process for manufacturing a transistor according to one embodiment of the present invention.

First, in a manner similar to that in the process for manufacturing the transistor which is described with reference to FIGS. 2A to 2E, the oxide semiconductor layer 10 is formed over the substrate 100, and the conductive layer 20a is formed (see FIG. 4A).

Figure 4B:
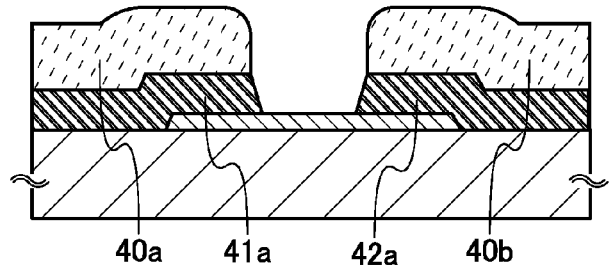

Then, a resist mask 40a and a resist mask 40b are formed over the conductive layer 20a (see FIG. 4B). For example, after the conductive layer 20a is coated with a resist, a photomask is set in a light-exposure apparatus and light is projected on the resist, so that the resist is exposed to light. Then, the resist is developed, so that the resist mask 40a and the resist mask 40b can be formed.

In order to form a channel length of the transistor minutely, light with a wavelength less than or equal to 365 nm is preferably used as a light source of the light-exposure apparatus. For example, light having a spectrum of a high pressure mercury lamp such as the i-line (with a wavelength of 365 nm), or light with a wavelength in the range from an ultraviolet light region to a visible light region, such as KrF laser light (with a wavelength of 248 nm) or ArF laser light (with a wavelength of 193 nm), is preferably used.

After the resist mask 40a and the resist mask 40b are formed, the conductive layer 20a is etched with the masks, whereby a conductive layer 41a and a conductive layer 42a are formed.

Figure 4C:
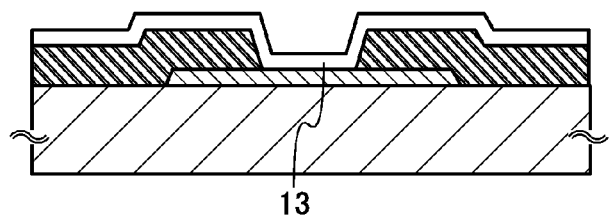

Next, in a manner similar to that in the process for manufacturing the transistor which is described with reference to FIGS. 2A to 2E, the insulating layer 13 is formed (see FIG. 4C).

Next, planarization treatment is performed on the insulating layer 13, the conductive layer 41a, and the conductive layer 42a, whereby an insulating layer 43 and conductive layers 41b and 42b are formed. As the planarization treatment, chemical mechanical polishing (CMP) treatment can be used.

Here, the CMP treatment is a treatment of planarizing a surface of an object to be processed by a combination of chemical and mechanical actions. In general, the CMP treatment is treatment in which a polishing cloth is attached to a polishing stage, the polishing stage and the object to be processed are each rotated or swung while a slurry (an abrasive) is supplied between the object to be processed and the polishing cloth, and the surface of the object to be processed is polished by chemical reaction between the slurry and the surface of the object to be processed and by action of mechanical polishing of the object to be processed with the polishing cloth.

Note that the CMP treatment may be performed only once or plural times. When the CMP treatment is performed plural times, first polishing is preferably performed with a high polishing rate followed by final polishing with a low polishing rate. By combining polishing with different polishing rates, planarity of the surfaces of the insulating layer 13 and the conductive layers 41b and 42b can be further improved.

Figure 4D:
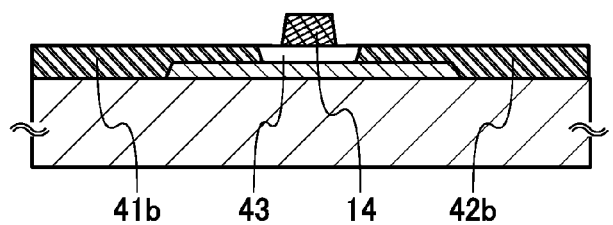

Next, in a manner similar to that in the process for manufacturing the transistor which is described with reference to FIGS. 2A to 2E, the conductive layer 14 is formed (see FIG. 4D).

Figure 4E:
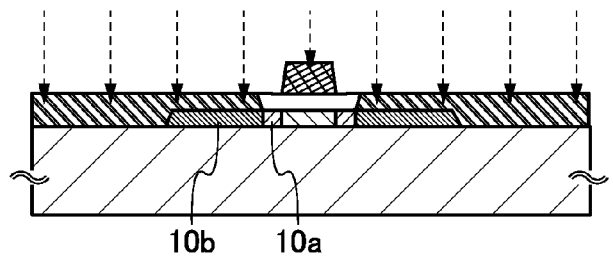

Next, in a manner similar to that in the process for manufacturing the transistor which is described with reference to FIGS. 2A to 2E, the resistance-reducing element is introduced into the oxide semiconductor layer 10 (see FIG. 4E).

Thus, in the oxide semiconductor layer 10, the concentration of the resistance-reducing element in the region 10b overlapping with the conductive layer 41b or the conductive layer 42b can be higher than the concentration of the resistance-reducing element in a region overlapping with the conductive layer 14. Further, the concentration of the resistance-reducing element in the region 10a which does not overlap with the conductive layer 41b, the conductive layer 42b, or the conductive layer 14 can be higher than the concentration of the resistance-reducing element in the region 10b.

By the above-described process, the transistor having an advantageous effect similar to that of the transistor shown in FIGS. 1A to 1C is completed.

1-3-3. Modification Example 3

FIGS. 5A to 5E illustrate an example of a process for manufacturing the transistor which is one embodiment of the present invention. Note that FIGS. 5A to 5E are cross-sectional views at respective stages of a process for manufacturing the transistor.

Figure 5A:
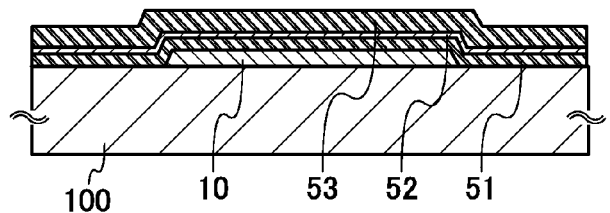
FIGS. 5A to 5E are cross-sectional views at respective stages of a process for manufacturing a transistor according to one embodiment of the present invention.
Figure 5B:
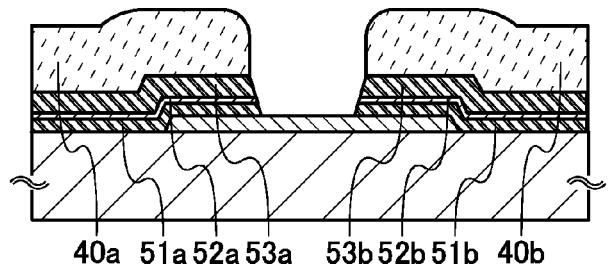

First, in a manner similar to that in the process for manufacturing the transistor which is described with reference to FIGS. 2A to 2E, the oxide semiconductor layer 10 is formed over the substrate 100 (see FIG. 5A).

Next, a conductive layer 51, a conductive layer 52, and a conductive layer 53 are formed. Note that as the formation method, a method similar to the method for forming the conductive layer 20a which is described with reference to FIG. 2A can be used.

Next, in a manner similar to that in the process for manufacturing the transistor which is described with reference to FIGS. 4A to 4E, the resist mask 40a and the resist mask 40b are formed. Then, the conductive layer 51, the conductive layer 52, and the conductive layer 53 are etched with the use of the resist mask 40a and the resist mask 40b, whereby conductive layers 51a, 52a, and 53a and conductive layers 51b, 52b, and 53b are formed (see FIG. 5B).

Figure 5C:
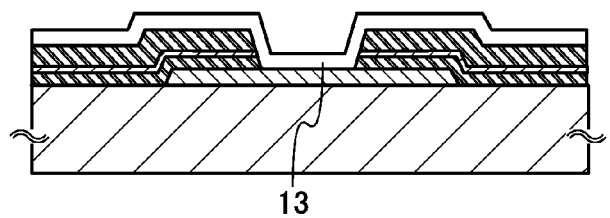

Next, in a manner similar to that in the process for manufacturing the transistor which is described with reference to FIGS. 2A to 2E, the insulating layer 13 is formed (see FIG. 5C).

Next, in a manner similar to that in the process for manufacturing the transistor which is described with reference to FIGS. 4A to 4E, planarization treatment is performed on the insulating layer 13, the conductive layer 53a, and the conductive layer 53b, whereby the insulating layer 43 and conductive layers 53c and 53d are formed.

Note that the conductive layer 51a, the conductive layer 52a, and the conductive layer 53c form the conductive layer 11 which serves as one of a source and a drain, and the conductive layer 51b, the conductive layer 52b, and the conductive layer 53d form the conductive layer 12 which serves as the other of the source and the drain.

Figure 5D:
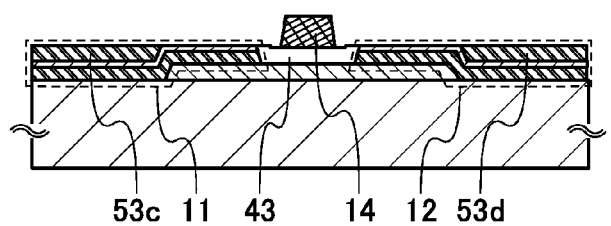

Next, in a manner similar to that in the process for manufacturing the transistor which is described with reference to FIGS. 2A to 2E, the conductive layer 14 is formed (see FIG. 5D).

Figure 5E:
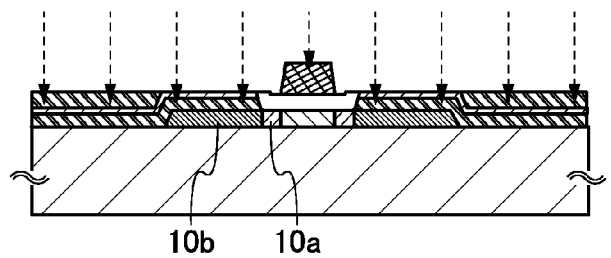

Next, in a manner similar to that in the process for manufacturing the transistor which is described with reference to FIGS. 2A to 2E, the resistance-reducing element is introduced into the oxide semiconductor layer 10 (see FIG. 5E).

Thus, in the oxide semiconductor layer 10, the concentration of the resistance-reducing element in the region 10b overlapping with the conductive layer 11 or the conductive layer 12 can be higher than the concentration of the resistance-reducing element in a region overlapping with the conductive layer 14. Further, the concentration of the resistance-reducing element in the region 10a which does not overlap with the conductive layer 11, the conductive layer 12, or the conductive layer 14 can be higher than the concentration of the resistance-reducing element in the region 10b.

By the above-described process, the transistor having an advantageous effect similar to that of the transistor shown in FIGS. 1A to 1C is completed.

2. Embodiment 2

In this embodiment, a transistor according to one embodiment of the present invention which is different from the transistor described in Embodiment 1 and a method for manufacturing the transistor are described with reference to FIGS. 10A to 10C, FIGS. 11A to 11E, FIGS. 12A to 12D, FIGS. 13A to 13C, and FIGS. 14A to 14C.

2-1. Example of Structure of Transistor

Figure 10A:
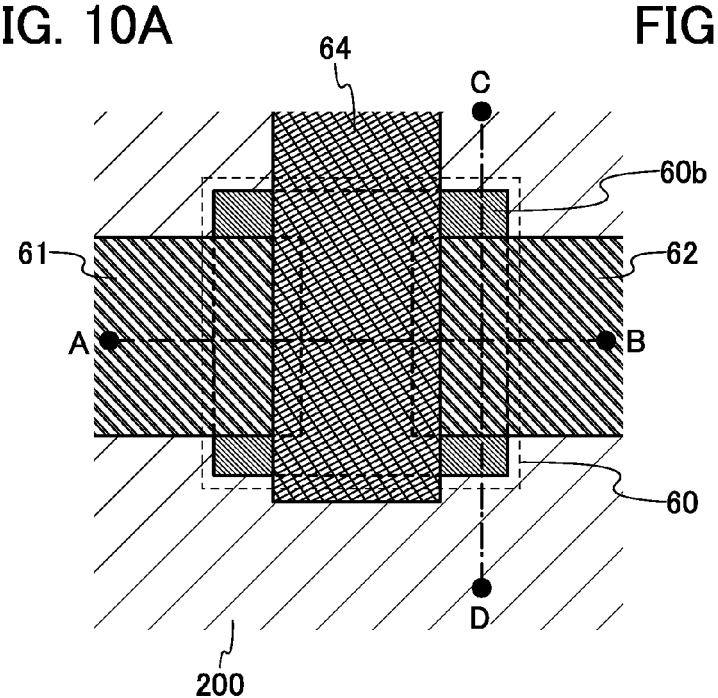
FIG. 10A is a plan view of a transistor according to one embodiment of the present invention.
Figure 10C:
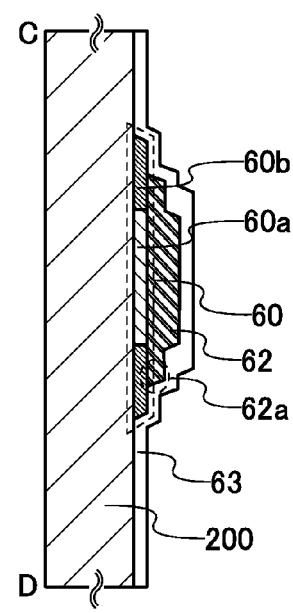
FIGS. 10B and 10C are cross-sectional views of the transistor.
Figure 10B:
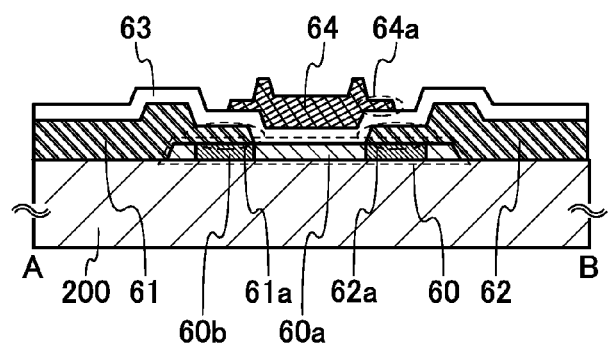

FIGS. 10A to 10C illustrate an example of a structure of a transistor. Specifically, FIG. 10A is a plan view of the transistor, FIG. 10B is a cross-sectional view taken along line A-B in FIG. 10A, and FIG. 10C is a cross-sectional view taken along line C-D in FIG. 10A.

The transistor shown in FIGS. 10A to 10C includes an oxide semiconductor layer 60 which is provided over a substrate 200, a conductive layer 61 and a conductive layer 62 which are provided over the oxide semiconductor layer 60, an insulating layer 63 which is provided over the oxide semiconductor layer 60 and the conductive layers 61 and 62, and a conductive layer 64 which is provided over the insulating layer 63. Note that the transistor shown in FIGS. 10A to 10C is a transistor in which the conductive layer 61 and the conductive layer 62 serve as a source and a drain, the insulating layer 63 serves as a gate insulating layer, and the conductive layer 64 serves as a gate.

The conductive layer 64 has a plurality of portions with different film thicknesses. Specifically, the film thickness of an edge portion 64a of the conductive layer 64 which lies in a region overlapping with the oxide semiconductor layer 60 and one of the conductive layers 61 and 62 is smaller than the film thickness of the other region of the conductive layer 64.

Further, the conductive layer 61 and the conductive layer 62 have a plurality of portions with different film thicknesses. Specifically, the film thickness of each of an edge portion 61a of the conductive layer 61 and an edge portion 62a of the conductive layer 62 which lies in a region overlapping with the oxide semiconductor layer 60 is smaller than the film thickness of each of the conductive layers 61 and 62 which lies in the other region.

The edge portion 64a of the conductive layer 64 overlaps with the edge portion 61a of the conductive layer 61 and the edge portion 62a of the conductive layer 62 at least partly.

The oxide semiconductor layer 60 has a plurality of regions with different concentrations of a resistance-reducing element. Specifically, the concentration of the resistance-reducing element in a region 60a overlapping with the conductive layer 61 (excluding the edge portion 61a), the conductive layer 62 (excluding the edge portion 62a), or the conductive layer 64 (excluding the edge portion 64a) is lower than the concentration of the resistance-reducing element in the other region 60b (a region which does not overlap with any of the conductive layers 61, 62, and 64, a region which overlaps with the edge portion 61a of the conductive layer 61 but does not overlap with the conductive layer 64, a region which overlaps with the edge portion 62a of the conductive layer 62 but does not overlap with the conductive layer 64, and a region which overlaps with the edge portion 61a of the conductive layer 61 or the edge portion 62a of the conductive layer 62 and overlaps with the edge portion 64a of the conductive layer 64).

In the transistor shown in FIGS. 10A to 10C, the concentration of the resistance-reducing element in the region 60b in the oxide semiconductor layer 60 is higher than the concentration of the resistance-reducing element in the region 60a in the oxide semiconductor layer 60. Thus, the contact resistance between the oxide semiconductor layer 60 and each of the conductive layers 61 and 62 can be reduced. As a result, the on-state current of the transistor can be increased.

Note that in the transistor shown in FIGS. 10A to 10C, the taper angle in each of the edge portion 61a and the edge portion 62a is preferably greater than or equal to 30° and less than or equal to 60°. This is for prevention of poor connection of the transistor by improving coverage of the edge portion 61a and the edge portion 62a with the insulating layer 63. The taper angle here refers to an angle formed by the side surface of a layer which has a tapered shape and the bottom surface of the layer.

The oxide semiconductor layer 60 is formed using a material similar to the material of the oxide semiconductor layer 10 described in <1. Embodiment 1>. The conductive layer 61 and the conductive layer 62 are formed using a material similar to the material of the conductive layer 11 and the conductive layer 12 which are described in <1. Embodiment 1>. The insulating layer 63 is formed using a material similar to the material of the insulating layer 13 described in <1. Embodiment 1>. The conductive layer 64 is formed using a material similar to the material of the conductive layer 14 described in <1. Embodiment 1>.

2-2. Example of Process for Manufacturing Transistor

FIGS. 11A to 11E and FIGS. 12A to 12D are cross-sectional views at respective stages of a process for manufacturing the transistor shown in FIGS. 10A to 10C. Note that FIGS. 11A to 11E and FIGS. 12A to 12D are cross-sectional views taken along line A-B in FIG. 10A.

First, in a manner similar to that of the oxide semiconductor layer 10 described in <1. Embodiment 1>, the oxide semiconductor layer 60 is formed.

Next, in a manner similar to that of the conductive layers 11 and 12 described in <1. Embodiment 1>, the conductive layers 61 and 62 are formed.

Figure 11A:
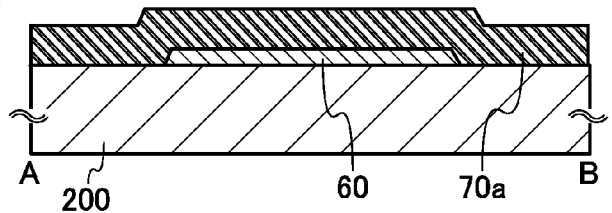
FIGS. 11A to 11E are cross-sectional views at respective stages of a process for manufacturing a transistor according to one embodiment of the present invention.
Figure 11B:
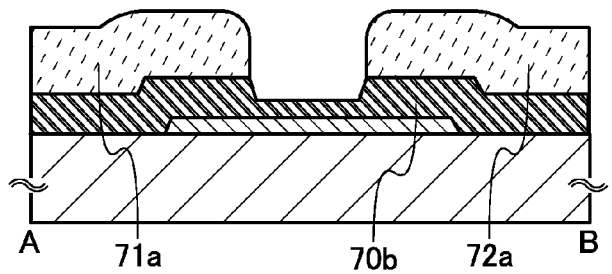
Figure 11C:
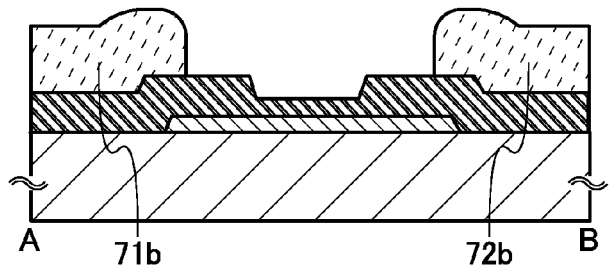
Figure 11D:
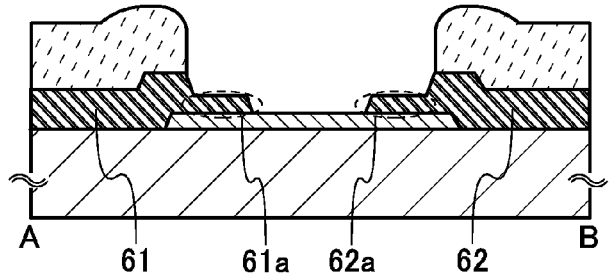
Figure 11E:
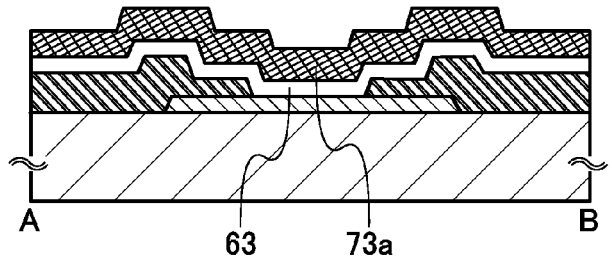

Specifically, a conductive layer 70a is formed over the oxide semiconductor layer 60 (see FIG. 11A). Next, a resist mask 71a and a resist mask 72a are formed over the conductive layer 70a (see FIG. 11B). After the resist mask 71a and the resist mask 72a are formed, the conductive layer 70a is subjected to half etching with the use of the masks, whereby a conductive layer 70b having a recessed portion is formed. Then, the resist mask 71a and the resist mask 72a are made to recede (reduce), whereby a resist mask 71b and a resist mask 72b are formed (see FIG. 11C). Next, the conductive layer 70b is etched with the use of the resist mask 71b and the resist mask 72b, whereby the conductive layer 61 and the conductive layer 62 are formed (see FIG. 11D). Note that the film thickness of the edge portion 61a of the conductive layer 61 and the film thickness of the edge portion 62a of the conductive layer 62 are smaller than the film thickness of the other portion of each of the conductive layers 61 and 62.

Next, in a manner similar to that of the insulating layer 13 described in <1. Embodiment 1>, the insulating layer 63 is formed over the oxide semiconductor layer 60, the conductive layer 61, and the conductive layer 62 (see FIG. 11E). After the insulating layer 63 is formed, heat treatment may be performed in a manner similar to that in <1. Embodiment 1>.

Next, a conductive layer 73a is formed over the insulating layer 63.

Figure 12A:
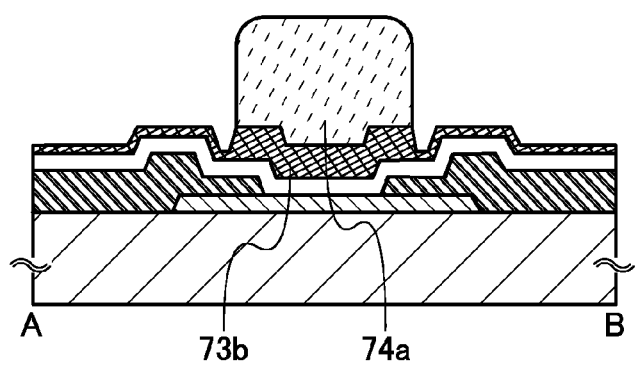
FIGS. 12A to 12D are cross-sectional views at respective stages of a process for manufacturing a transistor according to one embodiment of the present invention.

Next, a resist mask 74a is formed over the conductive layer 73a (see FIG. 12A).

After the resist mask 74a is formed, the conductive layer 73a is subjected to half etching with the use of the mask, whereby a conductive layer 73b having a projected portion is formed.

Figure 12B:
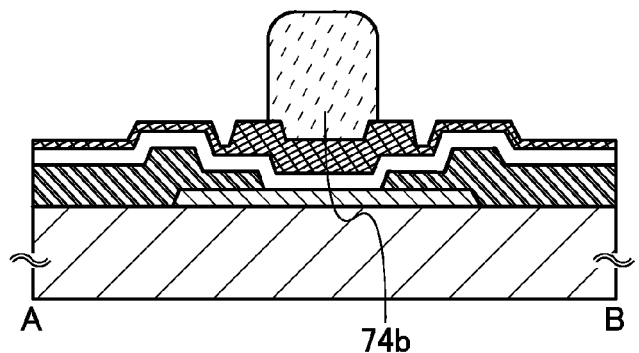

Then, the resist mask 74a is made to recede (reduce), whereby a resist mask 74b is formed (see FIG. 12B). By making the resist mask recede (reduce), a part of the conductive layer 73b is exposed.

Figure 12C:
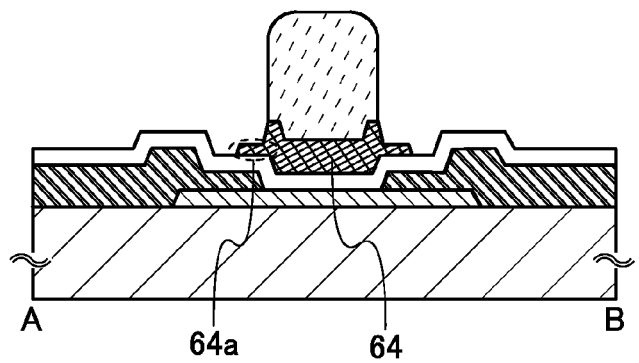

Next, the conductive layer 73b is etched with the use of the resist mask 74b, whereby the conductive layer 64 is formed (see FIG. 12C). Because the part of the conductive layer 73b which is exposed by the formation of the resist mask 74b is etched, the conductive layer 64 having the edge portion 64a with a small film thickness is obtained.

Figure 12D:
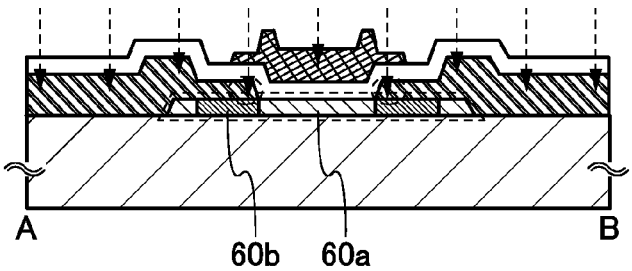

Next, the resistance-reducing element is introduced into the oxide semiconductor layer 60 (see FIG. 12D).

The resistance-reducing element can be introduced by an ion doping method or an ion implantation method. The introduction is performed on the oxide semiconductor layer 60 through the conductive layer 61, the conductive layer 62, the conductive layer 64, and the insulating layer 63. Thus, the concentration of the resistance-reducing element introduced into each region of the oxide semiconductor layer 60 can be controlled depending on whether or not the region overlaps with the conductive layer, for example. Here, the introduction of the resistance-reducing element is performed so that the concentration of the resistance-reducing element in the region 60b is higher than the concentration of the resistance-reducing element in the region 60a.

By the above-described process, the transistor shown in FIGS. 10A to 10C is completed.

2-3. Modification Examples of Transistor and Manufacturing Process Thereof

The transistor shown in FIGS. 10A to 10C is one embodiment of the present invention. The present invention also includes a transistor having a structure different from that of the transistor shown in FIGS. 10A to 10C and a process for manufacturing the transistor which is different from that for manufacturing the transistor shown in FIGS. 11A to 11E and FIGS. 12A to 12E.

2-3-1. Modification Example 1

Figure 13A:
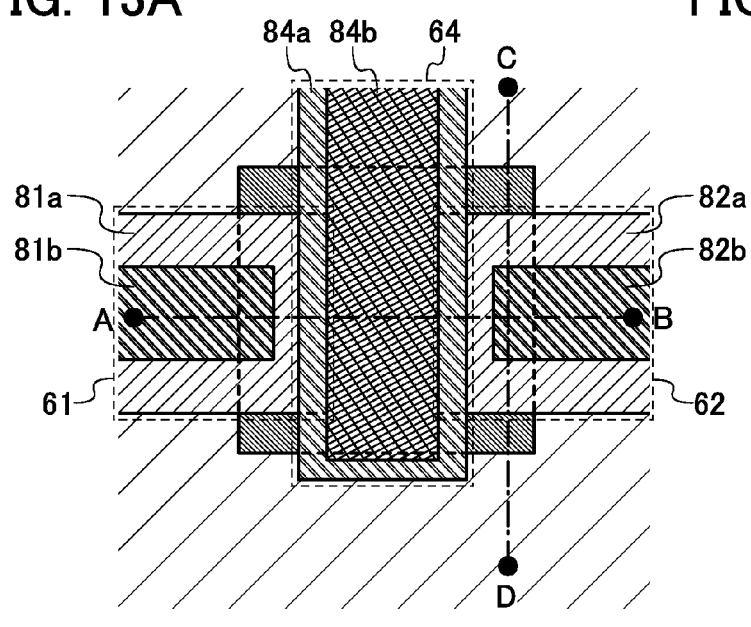
FIG. 13A is a plan view of a transistor according to one embodiment of the present invention.
Figure 13C:
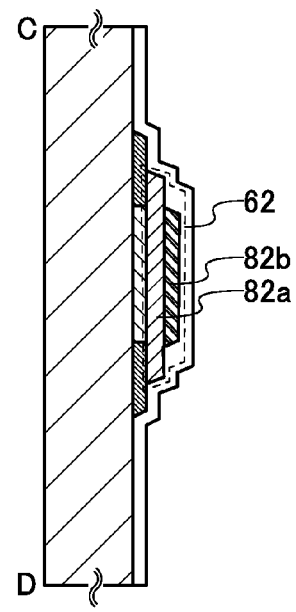
FIGS. 13B and 13C are cross-sectional views of the transistor.
Figure 13B:
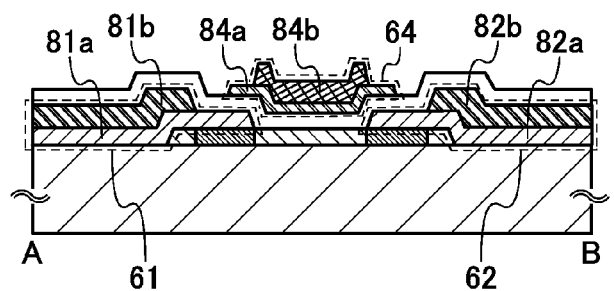

FIGS. 13A to 13C illustrate a transistor which is one embodiment of the present invention. Note that the transistor shown in FIGS. 13A to 13C is different from the transistor shown in FIGS. 10A to 10C in the structures of the conductive layer 61, the conductive layer 62, and the conductive layer 64; however, the structures of other components in the transistor shown in FIGS. 13A to 13C are similar to those in the transistor shown in FIGS. 10A to 10C. Specifically, in the transistor shown in FIGS. 13A to 13C, the conductive layer 61 has a stacked-layer structure of a conductive layer 81a and a conductive layer 81b, the conductive layer 62 has a stacked-layer structure of a conductive layer 82a and a conductive layer 82b, and the conductive layer 64 has a stacked-layer structure of a conductive layer 84a and a conductive layer 84b. Note that the conductive layer 81b lies in a part of a region which overlaps with the conductive layer 81a (in a region which overlaps with the conductive layer 81a excluding the edge portion thereof). The conductive layer 82b lies in a part of a region which overlaps with the conductive layer 82a (in a region which overlaps with the conductive layer 82a excluding the edge portion thereof). The conductive layer 84b lies in a part of a region which overlaps with the conductive layer 84a (in a region which overlaps with the conductive layer 84a excluding the edge portion thereof).

The transistor having the structure shown in FIGS. 13A to 13C has an advantageous effect similar to that of the transistor shown in FIGS. 10A to 10C. That is, by reducing the contact resistance between the oxide semiconductor layer and each of the conductive layers 61 and 62, the on-state current of the transistor can be increased.

Note that as a process for manufacturing the transistor shown in FIGS. 13A to 13C, a manufacturing process similar to the manufacturing process of the transistor which is described with reference to FIGS. 11A to 11E and FIGS. 12A to 12D can be used. In addition, in the transistor shown in FIGS. 13A to 13C, the film thicknesses of the edge portions of the conductive layers 61, 62, and 64 (the conductive layers 81a, 82a, and 84a) are controlled more easily than those in the transistor shown in FIGS. 10A to 10C. Specifically, in the transistor shown in FIGS. 13A to 13C, the film thickness of each of the edge portions of the conductive layers 61 and 62 can be controlled by selecting an etching condition in which the etching rate of a film which is to be the conductive layers 81b and 82b is higher than the etching rate of a film which is to be the conductive layers 81a and 82a and by adjusting the film thickness of each of the conductive layers 81a and 82a at the time of formation. Similarly, the film thickness of the edge portion of the conductive layer 64 can be controlled by selecting an etching condition in which the etching rate of a film which is to be the conductive layer 84b is higher than the etching rate of a film which is to be the conductive layer 84a and by adjusting the film thickness of the conductive layer 84a at the time of formation.

2-3-2. Modification Example 2

Figure 14A:
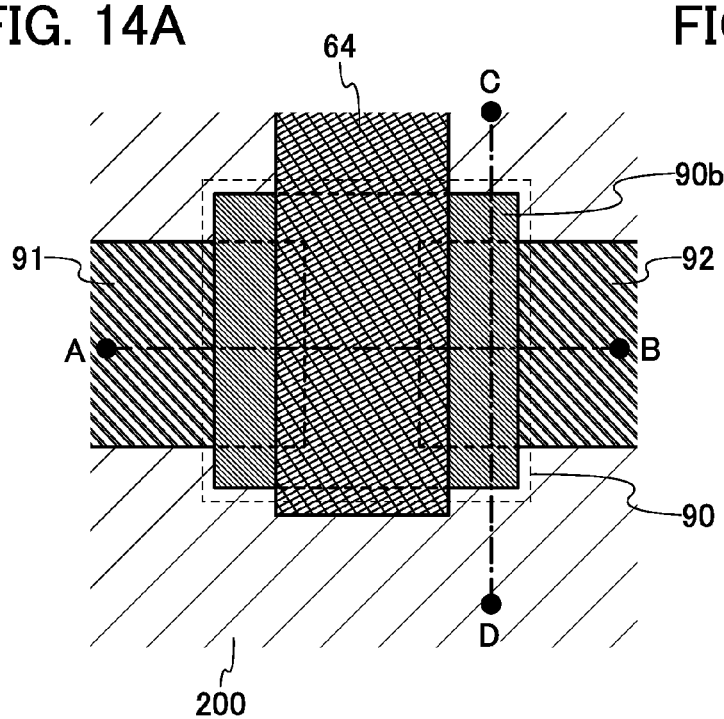
FIG. 14A is a plan view of a transistor according to one embodiment of the present invention.
Figure 14C:
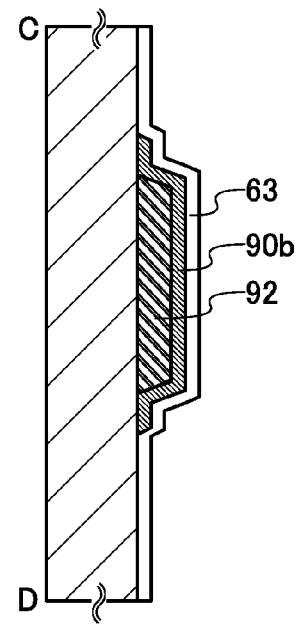
FIGS. 14B and 14C are cross-sectional views of the transistor.
Figure 14B:
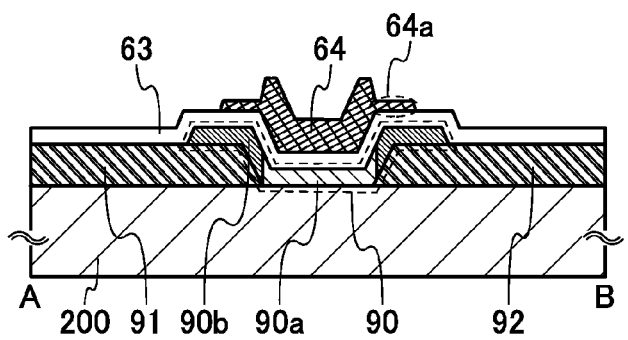

FIGS. 14A to 14C illustrate a transistor which is one embodiment of the present invention.

The transistor shown in FIGS. 14A to 14C includes a conductive layer 91 and a conductive layer 92 which are provided over a substrate 200, an oxide semiconductor layer 90 which is provided over the conductive layer 91 and the conductive layer 92, an insulating layer 63 which is provided over the oxide semiconductor layer 90, the conductive layer 91, and the conductive layer 92, and a conductive layer 64 which is provided over the insulating layer 63. In short, the transistor shown in FIGS. 14A to 14C is different from the transistor shown in FIGS. 10A to 10C in that the conductive layers 91 and 92 serving as a source and a drain are provided under the oxide semiconductor layer 90.

The oxide semiconductor layer 90 has a plurality of regions with different concentrations of a resistance-reducing element. Specifically, the concentration of the resistance-reducing element in a region 90a overlapping with the conductive layer 64 (excluding the edge portion 64a) is lower than the concentration of the resistance-reducing element in the other region 90b (a region which does not overlap with the conductive layer 64 and a region which overlaps with the edge portion 64a of the conductive layer 64).

The transistor having the structure shown in FIGS. 14A to 14C has an advantageous effect similar to that of the transistor shown in FIGS. 10A to 10C. That is, by reducing the contact resistance between the oxide semiconductor layer 90 and each of the conductive layers 91 and 92, the on-state current of the transistor can be increased.

Note that as a process for manufacturing the transistor shown in FIGS. 14A to 14C, a manufacturing process obtained by changing part of the process for manufacturing the transistor which is described with reference to FIGS. 11A to 11E and FIGS. 12A to 12D can be used. Specifically, it is possible to use a process similar to the process for manufacturing the transistor which is described with reference to FIGS. 11A to 11E and FIGS. 12A to 12D, except that the order of the step of forming the conductive layer serving as a source or a drain and the step of forming the oxide semiconductor layer is reversed and that the edge portion of the conductive layer serving as a source or a drain is not thinned (a step of half etching or the like is not provided).

Example

Examples of a semiconductor device including the transistor described in either of the above embodiments are described below with reference to FIGS. 6A to 6C, FIG. 7, FIGS. 8A to 8C, and FIGS. 9A and 9B.

<Memory Device>

Figure 6A:
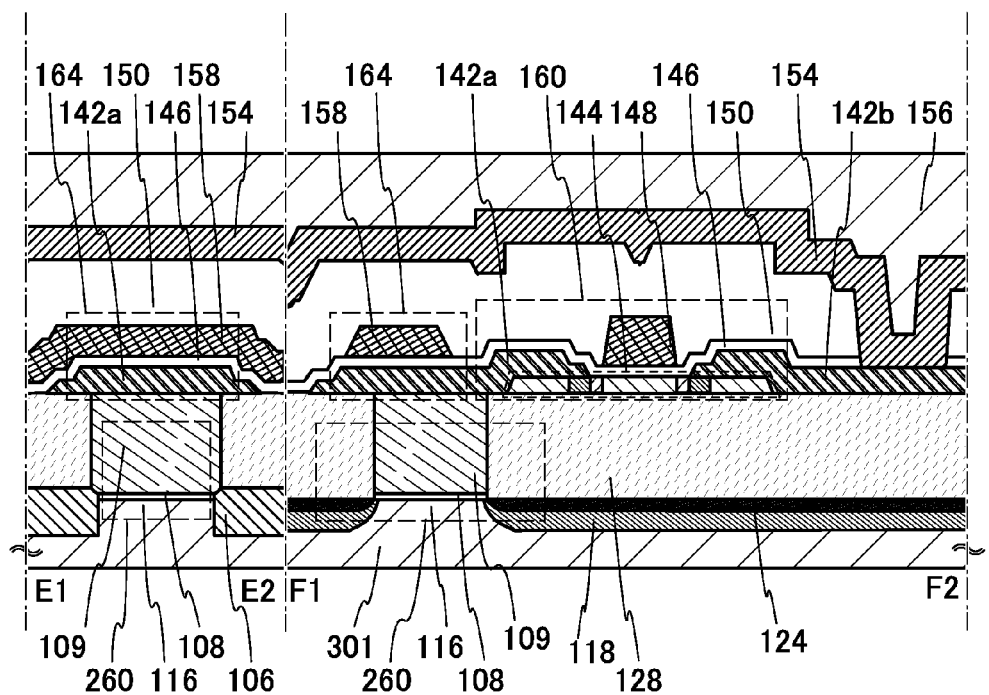
FIG. 6A is a cross-sectional view illustrating an example of a structure of a memory element.
Figure 6B:
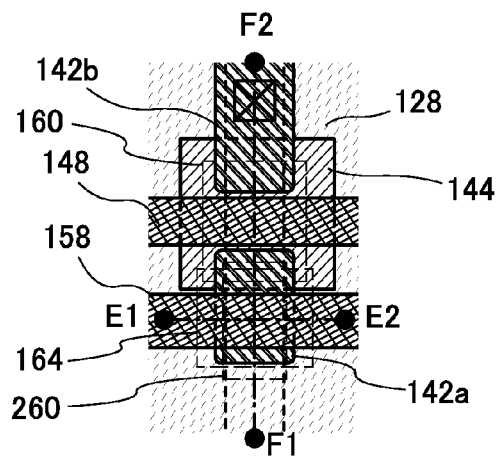
FIG. 6B is a plan view illustrating the example.
Figure 6C:
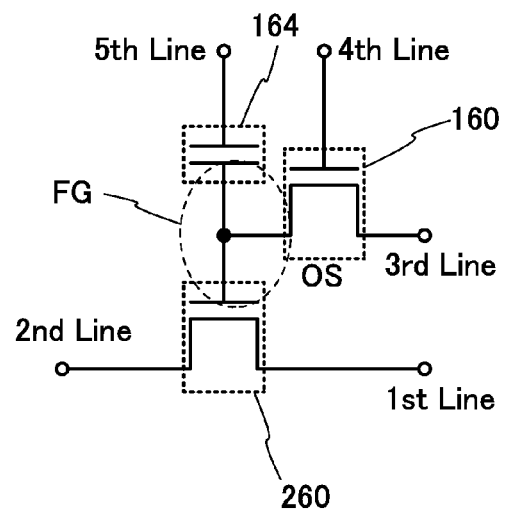
FIG. 6C is a circuit diagram illustrating the example.

FIGS. 6A to 6C illustrate an example of a structure of a memory element included in a memory device. FIG. 6A is a cross-section view of the memory element and FIG. 6B is a plan view of the memory element. Here, FIG. 6A is a cross-sectional view along E1-E2 and F1-F2 in FIG. 6B. FIG. 6C is a circuit diagram of the memory element. The memory device illustrated in FIGS. 6A and 6B includes a transistor including a first semiconductor material in a lower portion, and a transistor including a second semiconductor material in an upper portion. In the memory element shown in FIGS. 6A to 6C, a transistor 260 including a first semiconductor material is a transistor including a semiconductor material other than an oxide semiconductor, and a transistor 160 including a second semiconductor material is the transistor described in either of the above embodiments. As the semiconductor material other than an oxide semiconductor, for example, silicon, germanium, silicon germanium, silicon carbide, gallium arsenide, or the like can be used, and a single crystal semiconductor is preferably used. A transistor including such a semiconductor material other than an oxide semiconductor can operate at high speed easily. On the other hand, the transistor 160 can hold charge for a long time because of its characteristics. FIGS. 6A and 6B illustrate an example in which the transistor shown in FIGS. 1A to 1C is used as the transistor 160, but a structure of the transistor 160 is not limited to the structure shown in FIGS. 1A to 1C. For example, the transistor shown in FIGS. 3A to 3C can be used as the transistor 160.

The transistor 260 in FIGS. 6A to 6C includes a channel formation region 116 provided in a substrate 301 including a semiconductor material (such as silicon), impurity regions 118 provided such that the channel formation region 116 is sandwiched therebetween, intermetallic compound regions 124 in contact with the impurity regions 118, a gate insulating layer 108 provided over the channel formation region 116, and a gate electrode 109 provided over the gate insulating layer 108.

As the substrate 301 including a semiconductor material, a single crystal semiconductor substrate or a polycrystalline semiconductor substrate of silicon, silicon carbide, or the like; a compound semiconductor substrate of silicon germanium or the like; an SOI substrate; or the like can be used. Note that although the term "SOI substrate" generally means a substrate in which a silicon semiconductor layer is provided on an insulating surface, the term "SOI substrate" in this specification and the like also includes a substrate in which a semiconductor layer including a material other than silicon is provided on an insulating surface. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer interposed therebetween.

Further, in the memory element shown in FIGS. 6A and 6B, an element isolation insulating layer 106 is provided so as to surround the transistor 260, and an insulating layer 128 is provided so as to cover the transistor 260. Note that in order to obtain high integration of the memory device including the memory element shown in FIGS. 6A and 6B, the transistor 260 preferably does not have a sidewall insulating layer as illustrated in FIG. 6A. On the other hand, when importance is put on the characteristics of the transistor 260, a sidewall insulating layer may be provided on a side surface of the gate electrode 109, and the impurity regions 118 may include regions with different impurity concentrations.

The transistor 260 can be manufactured by a known technique. A feature of the transistor 260 including, for example, silicon, germanium, silicon germanium, silicon carbide, gallium arsenide, or the like, as a semiconductor material, is that it can operate at high speed. Thus, when the transistor is used as a reading transistor, data can be read at a high speed.

After the transistor 260 is formed, as treatment prior to the formation of the transistor 160 and a capacitor 164, the insulating layer 128 is subjected to CMP treatment so that the top surface of the gate electrode 109 is exposed. As treatment for exposing the top surface of the gate electrode 109, as well as CMP treatment, etching treatment or the like can be employed; in order to improve characteristics of the transistor 160, the surface of the insulating layer 128 is preferably made as planar as possible.

The transistor 160 in which a channel is formed in an oxide semiconductor layer 144 is provided over the planarized insulating layer 128. For a specific method for manufacturing the transistor 160, the above description can be referred to. Note that a source electrode 142a of the transistor 160 is formed to be electrically connected to the gate electrode 109 of the transistor 260.

In the memory element shown in FIGS. 6A and 6B, a conductive layer 158 is provided to overlap with at least part of the source electrode 142a with a gate insulating layer 146 positioned therebetween. The conductive layer 158 is formed in the same step as a gate electrode 148 and serves as one of electrodes of the capacitor 164.

An insulating layer 150 is provided over the gate electrode 148 and the conductive layer 158. A wiring 154 is provided over the insulating layer 150 and is connected to a drain electrode 142b of the transistor 160 in an opening formed in the insulating layer 150 and the gate insulating layer 146. Here, the wiring 154 is provided so as to overlap with the oxide semiconductor layer 144 of the transistor 160 at least partly. Further, an insulating layer 156 is provided so as to cover the wiring 154.

In the memory element illustrated in FIGS. 6A and 6B, the transistor 260 and the transistor 160 are provided so as to at least partly overlap with each other. In particular, the source region or the drain region of the transistor 260 and the oxide semiconductor layer 144 are preferably provided so as to overlap with each other at least partly. The wiring 154 is provided so as to overlap with the oxide semiconductor layer 144 at least partly. In addition, the transistor 160 and the capacitor 164 are provided to overlap with the transistor 260.

For example, the conductive layer 158 of the capacitor 164 is provided so as to at least partly overlap with the gate electrode 109 of the transistor 260. With such a planar layout, high integration of the memory device including the memory element can be achieved. For example, in the case where a memory cell is formed using the memory element, given that the minimum feature size is F, the area occupied by the memory cell can be 15 $F^2$ to 25 $F^2$.

In FIG. 6C, one of the source electrode and the drain electrode of the transistor 160, one electrode of the capacitor 164, and the gate electrode of the transistor 260 are electrically connected to one another. A first wiring (which is denoted by "1st Line" and also called a source line) is electrically connected to a source electrode of the transistor 260. A second wiring (which is denoted by "2nd Line" and also called a bit line) is electrically connected to a drain electrode of the transistor 260. A third wiring (which is denoted by "3rd Line" and also called a first signal line) is electrically connected to the other of the source electrode and the drain electrode of the transistor 160. A fourth wiring (which is denoted by "4th Line" and also called a second signal line) is electrically connected to the gate electrode of the transistor 160. A fifth wiring (which is denoted by "5th Line" and also called a word line) is electrically connected to the other electrode of the capacitor 164.

The transistor 160 in which a channel is formed in the oxide semiconductor layer has extremely small off-state current; therefore, when the transistor 160 is in an off state, the potential of a node (hereinafter, a node FG) where the one of the source electrode and the drain electrode of the transistor 160, the one electrode of the capacitor 164, and the gate electrode of the transistor 260 are electrically connected to one another can be held for an extremely long time. The capacitor 164 facilitates holding of charge given to the node FG and reading of the held data.

When data is stored (written) in the memory element shown in FIGS. 6A to 6C, first, the potential of the fourth wiring is set to a potential at which the transistor 160 is turned on, whereby the transistor 160 is turned on. Thus, the potential of the third wiring is applied to the node FG and a predetermined amount of charge is accumulated in the node FG. Here, charge for applying either two different potential levels (hereinafter referred to as low-level charge and high-level charge) is given to the node FG. After that, the potential of the fourth wiring is set to a potential at which the transistor 160 is turned off, whereby the transistor 160 is turned off. This makes the node FG floating and the predetermined amount of charge is held in the node FG. The predetermined amount of charge is thus accumulated and held in the node FG, whereby the memory cell can store data.

Since the off-state current of the transistor 160 is extremely small, the charge applied to the node FG is held for a long time. This can remove the need of refresh operation or drastically reduce the frequency of the refresh operation, which leads to a sufficient reduction in power consumption. Moreover, stored data can be stored for a long time even when power is not supplied.

When data stored in the memory element shown in FIGS. 6A to 6C is read out (reading), while a predetermined potential (a fixed potential) is applied to the first wiring, an appropriate potential (a read-out potential) is applied to the fifth wiring, whereby the transistor 160 changes its state depending on the amount of charge held in the node FG. This is because, when the transistor 160 is an n-channel transistor, an apparent threshold value $V_{th\_H}$ of the transistor 160 of the case where a high-level charge is held in the node FG is lower than an apparent threshold value $V_{th\_L}$ of the transistor 160 of the case where a low-level charge is held in the node FG. Here, an apparent threshold voltage refers to the potential of the fifth wiring, which is needed to turn on the transistor 260. Thus, by setting the potential of the fifth wiring to a potential $V_0$ which is between $V_{th\_H}$ and $V_{th\_L}$, charge held in the node FG can be determined. For example, in the case where a high-level charge is given in writing, when the potential of the fifth wiring is set to $V_0$ ($>V_{th\_H}$), the transistor 260 is turned on. In the case where a low-level charge is given in writing, even when the potential of the fifth wiring is set to $V_0$ ($<V_{th\_L}$), the transistor 260 remains in an off state. In such a manner, by controlling the potential of the fifth wiring and determining whether the transistor 260 is in an on state or off state (reading out the potential of the second wiring), the stored data can be read out.

Further, in order to rewrite data stored in the memory element shown in FIGS. 6A to 6C, a new potential is applied to the node FG which is holding the predetermined amount of charge given in the above writing, so that the charge of the new data is held in the node FG. Specifically, the potential of the fourth wiring is set to a potential at which the transistor 160 is turned on, so that the transistor 160 is turned on. Thus, the potential of the third wiring (a potential of new data) is applied to the node FG, and the predetermined amount of charge is accumulated in the node FG. After that, the potential of the fourth wiring is set to a potential at which the transistor 160 is turned off, whereby the transistor 160 is turned off. Thus, charge of the new data is held in the node FG. In other words, while the predetermined amount of charge given in the first writing is held in the node FG, the same operation (a second writing) as in the first writing is performed, whereby the stored data can be overwritten.

The off-state current of the transistor 160 can be sufficiently reduced by using the oxide semiconductor layer 144 which is highly purified to be intrinsic. Further, with the use of such a transistor, a memory element capable of holding stored data for an extremely long time can be obtained. Further, with use of the transistor 160 whose channel length (L) is reduced, the degree of integration of the memory device including the memory element can be increased.

The transistor 260 and the transistor 160 overlap with each other; thus, a memory device including a memory element whose integration degree is sufficiently improved is achieved.

Note that the memory element shown in FIGS. 6A to 6C is just an example; a memory element having the transistor described in either of the above embodiments is not limited to the memory element shown in FIGS. 6A to 6C.

Figure 7:
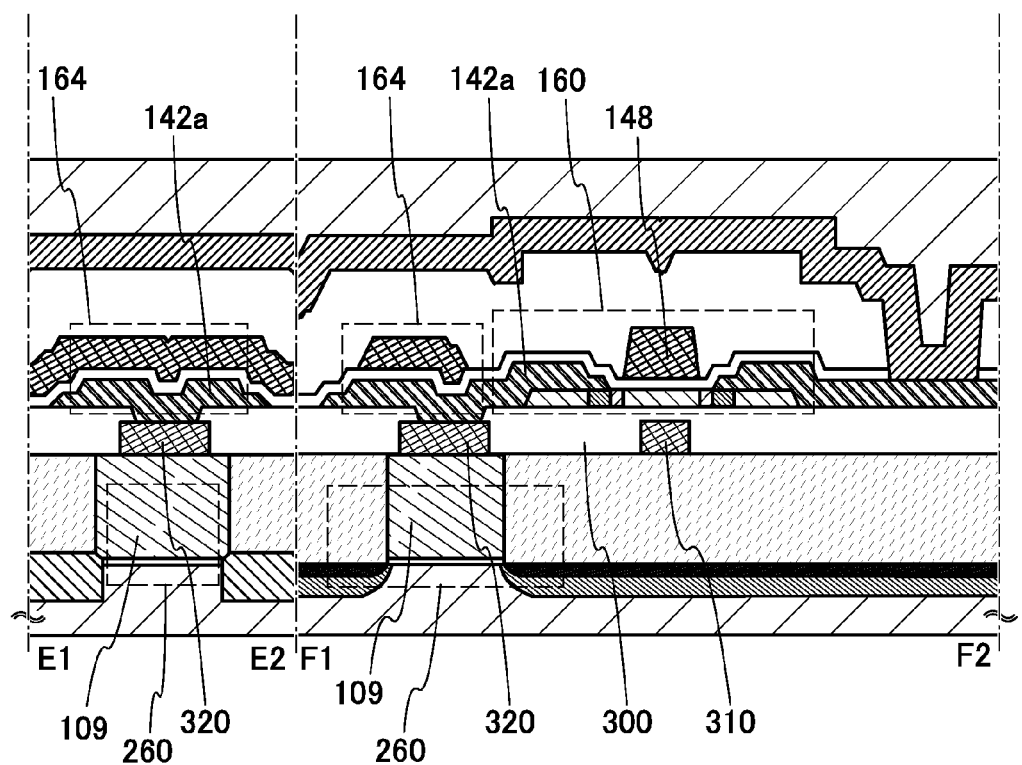
FIG. 7 is a cross-sectional view illustrating an example of a structure of a memory element.

For example, as a memory element including the transistor, a memory element including a structure shown in FIG. 7 can be used. Note that the memory element shown in FIG. 7 has a structure similar to that of the memory element shown in FIGS. 6A to 6C except that an insulating layer 300 and conductive layers 310 and 320 are provided between a layer in which the transistor 260 is provided and a layer in which the transistor 160 is provided. Note that in the memory element shown in FIG. 7, a desired potential can be supplied to the conductive layer 310. Further, the conductive layer 320 has a function of electrically connecting the gate electrode 109 to the source electrode 142*a*.

In the memory element shown in FIG. 7, a fixed potential such as a ground potential may be supplied to the conductive layer 310, whereby the negative shift of the threshold voltage of the transistor 160 can be inhibited. Alternatively, in the memory element shown in FIG. 7, a signal that synchronizes with a signal supplied to the gate electrode 148 may be supplied to the conductive layer 310, whereby the on-state current of the transistor 160 can be increased.

Further, the transistor described in either of the above embodiments can be used as a transistor provided in a memory element of a dynamic random access memory (DRAM).

<CPU>

Figure 8A:
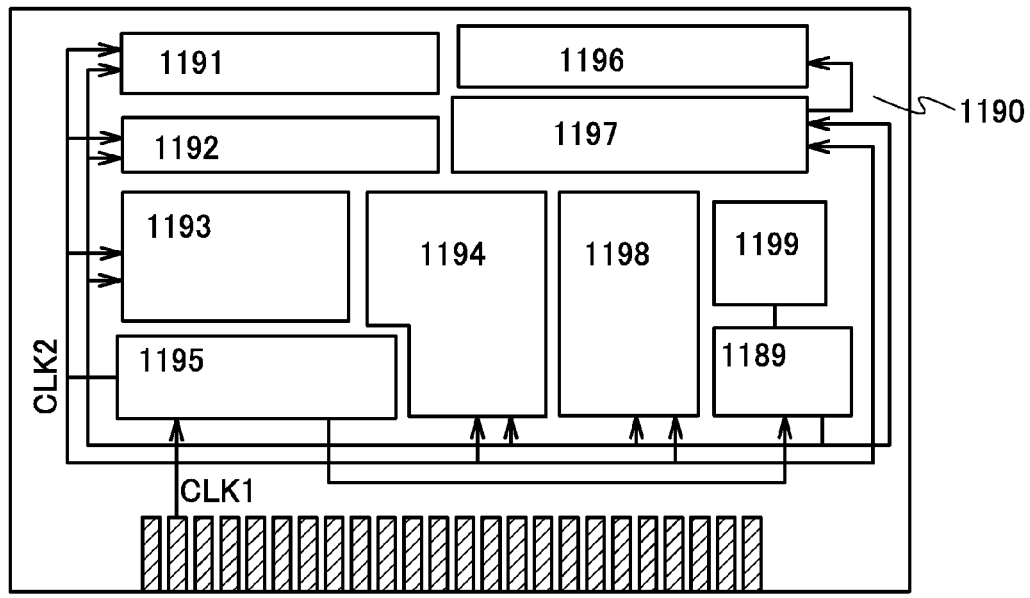
FIGS. 8A to 8C illustrate examples of a structure of a CPU.

FIG. 8A is a block diagram illustrating a specific example of a structure of a central processing unit (CPU). The CPU illustrated in FIG. 8A includes an arithmetic logic unit (ALU) 1191, an ALU controller 1192, an instruction decoder 1193, an interrupt controller 1194, a timing controller 1195, a register 1196, a register controller 1197, a bus interface (Bus I/F) 1198, a rewritable ROM 1199, and an ROM interface (ROM I/F) 1189 over a substrate 1190. As the substrate 1190, a semiconductor substrate, an SOI substrate, a glass substrate, or the like is given. The ROM 1199 and the ROM interface 1189 may each be provided over a separate chip. Obviously, the CPU shown in FIG. 8A is just an example in which a configuration is simplified, and an actual CPU may have various configurations depending on the application.

An instruction that is input to the CPU via the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads or writes data from/to the register 1196 in accordance with the state of the CPU. The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU shown in FIG. 8A, the register 1196 can include a memory unit having at least a logic circuit and either of the above-described memory elements.

In the CPU shown in FIG. 8A, the register controller 1197 selects an operation of holding data in the register 1196 in accordance with an instruction from the ALU 1191. That is, the register controller 1197 selects whether data is held by a logic circuit or by a capacitor (the memory element described above) in the register 1196. When data holding by the logic circuit is selected, power supply voltage is supplied to a memory unit in the register 1196. When data holding by the capacitor is selected, the data is rewritten in the capacitor, and supply of power supply voltage to the memory unit in the register 1196 can be stopped.

Figure 8B:
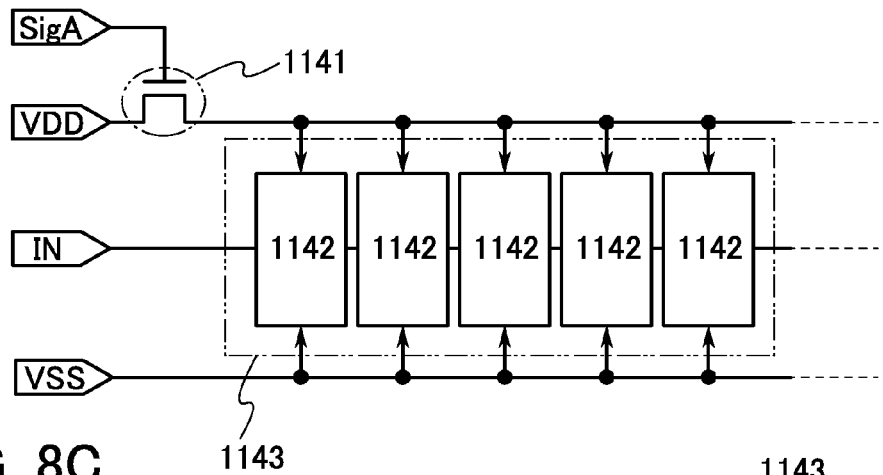
Figure 8C:
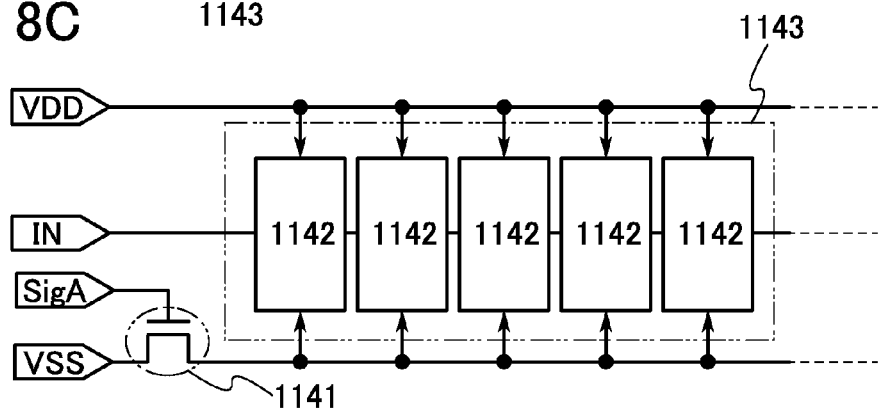

The power supply can be stopped by controlling switching of a switching element 1141 provided between a memory unit group 1143 and a node to which a power supply potential VDD or a power supply potential VSS is supplied, as illustrated in FIG. 8B or FIG. 8C. Circuits shown in FIGS. 8B and 8C are described below.

In the circuits shown in FIGS. 8B and 8C, as the switching element 1141, the transistor described in either of the above embodiments can be used.

The circuit shown in FIG. 8B includes the switching element 1141 and the memory unit group 1143 including a plurality of memory units 1142. Each of the memory units 1142 is supplied with a high-level power supply potential VDD via the switching element 1141. Further, each of the memory units 1142 is supplied with a potential of a signal IN and a low-level power supply potential VSS.

Note that the circuit in FIG. 8B shows the structure in which the switching element 1141 includes only one transistor; however, without particular limitation thereon, the switching element 1141 may include a plurality of transistors. In the case where the switching element 1141 includes a plurality of transistors which serves as switching elements, the plurality of transistors may be connected to each other in parallel, in series, or in combination of parallel connection and series connection.

Although the switching element 1141 controls the supply of the high-level power supply potential VDD to each of the memory units 1142 in the circuit shown in FIG. 8B, the switching element 1141 may control the supply of the low-level power supply potential VSS.

In the circuit shown in FIG. 8C, an example of a memory device in which each of the memory units 1142 is supplied with the low-level power supply potential VSS via the switching element 1141 is illustrated. The supply of the low-level power supply potential VSS to each of the memory units 1142 can be controlled by the switching element 1141.

In the CPU shown in FIGS. 8A to 8C, even in the case where the operation of the CPU is temporarily stopped and the supply of the power supply voltage is stopped, data can be held and the power consumption can be reduced. Specifically, for example, while a user of a personal computer does not input data to an input device such as a keyboard, the operation of the CPU can be stopped, so that the power consumption can be reduced.

Although the CPU is given as an example, the transistor can also be applied to an LSI such as a digital signal processor (DSP), a custom LSI, or a field programmable gate array (FPGA).

<Electronic Device>

A semiconductor device disclosed in this specification includes a variety of electronic devices. Specific examples of such electronic devices will be described below with reference to FIGS. 9A and 9B.

Figure 9A:
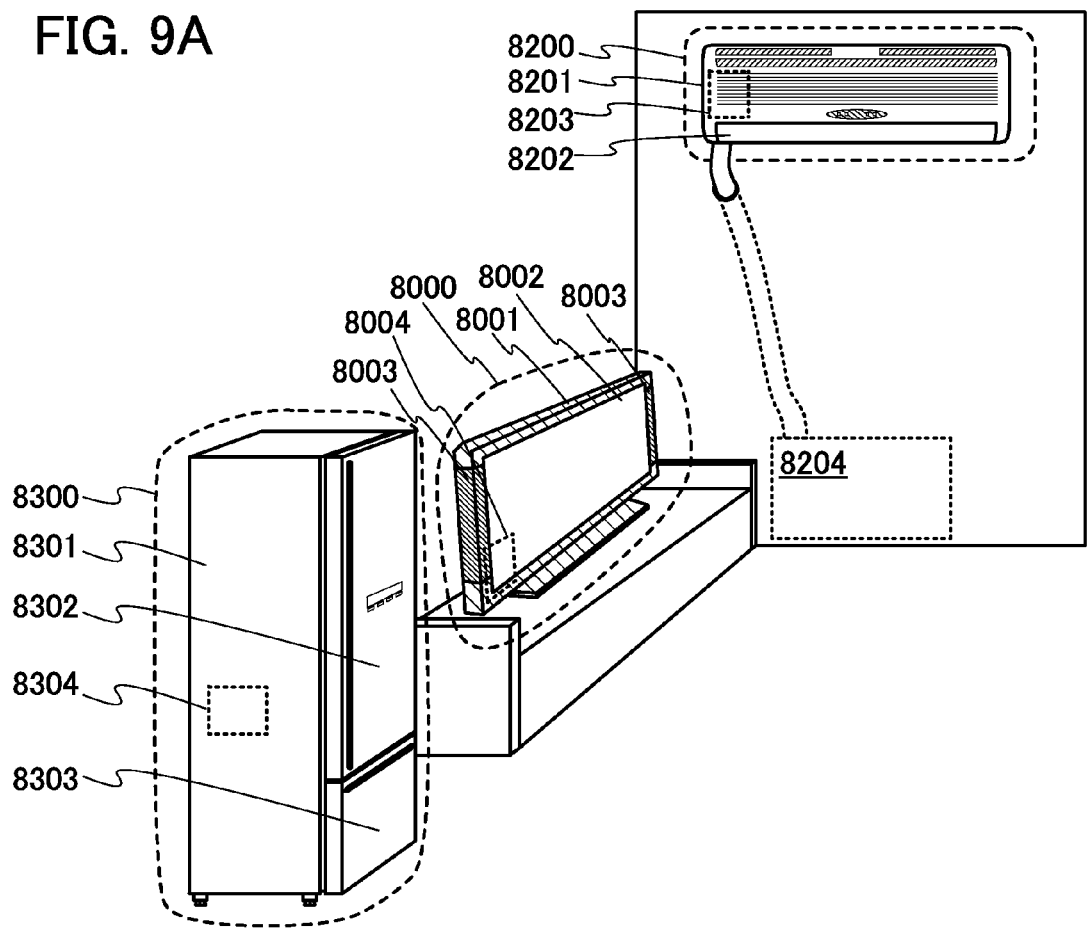
FIGS. 9A and 9B illustrate examples of an electronic device.

In a television set 8000 in FIG. 9A, a display portion 8002 is incorporated in a housing 8001. The display portion 8002 displays an image and a speaker portion 8003 can output sound. The transistor described in either of the above embodiments can be used for the display portion 8002.

A display device such as a liquid crystal display device, a light-emitting device in which a light-emitting element such as an organic EL element is provided in each pixel, an electrophoresis display device, a digital micromirror device (DMD), or a plasma display panel (PDP) can be used for the display portion 8002.

The television set 8000 may be provided with a receiver, a modem, and the like. Furthermore, when the television set 8000 is connected to a communication network by wired or wireless connection via the modem, one-way (from a transmitter to a receiver) or two-way (between a transmitter and a receiver, between receivers, or the like) data communication can be performed.

In addition, the television set 8000 may include a CPU for performing information communication or a memory. The television set 8000 can include at least one of the above-described memory element and CPU.

In FIG. 9A, an air conditioner which includes an indoor unit 8200 and an outdoor unit 8204 is an example of an electronic device in which the above-described CPU is used. Specifically, the indoor unit 8200 includes a housing 8201, an air outlet 8202, a CPU 8203, and the like. Although the CPU 8203 is provided in the indoor unit 8200 in FIG. 9A, the CPU 8203 may be provided in the outdoor unit 8204. Alternatively, the CPU 8203 may be provided in both the indoor unit 8200 and the outdoor unit 8204.

In FIG. 9A, an electric refrigerator-freezer 8300 is an example of an electronic device which is provided with the above-described CPU. Specifically, the electric refrigerator-freezer 8300 includes a housing 8301, a door for a refrigerator 8302, a door for a freezer 8303, a CPU 8304, and the like. In FIG. 9A, the CPU 8304 is provided in the housing 8301.

Figure 9B:
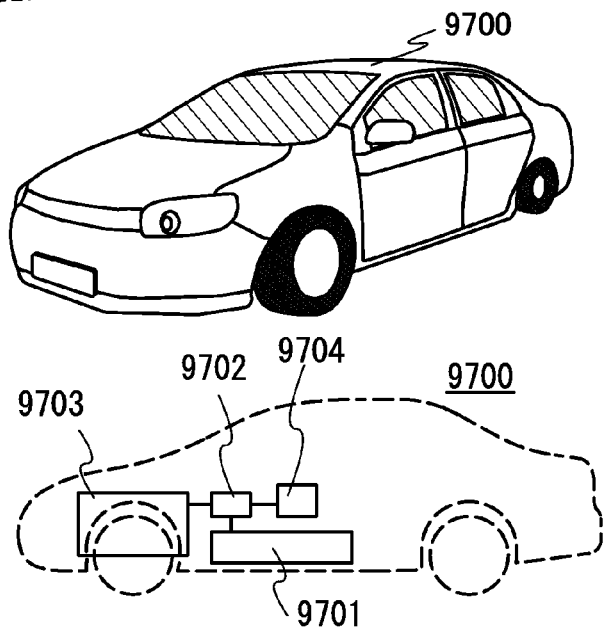

FIG. 9B illustrates an example of an electric vehicle which is an example of an electronic device. An electric vehicle 9700 is equipped with a secondary battery 9701. The output of the electric power of the secondary battery 9701 is adjusted by a control circuit 9702 and the electric power is supplied to a driving device 9703. The control circuit 9702 is controlled by a processing unit 9704 including a ROM, a RAM, a CPU, or the like which is not illustrated.

The driving device 9703 includes a DC motor or an AC motor either alone or in combination with an internal-combustion engine. The processing unit 9704 outputs a control signal to the control circuit 9702 on the basis of input data such as data of operation (e.g., acceleration, deceleration, or stop) by a driver or data during driving (e.g., data on an upgrade or a downgrade, or data on a load on a driving wheel) of the electric vehicle 9700. The control circuit 9702 adjusts the electric energy supplied from the secondary battery 9701 in accordance with the control signal of the processing unit 9704 to control the output of the driving device 9703. In the case where the AC motor is mounted, although not illustrated, an inverter which converts direct current into alternate current is also incorporated.

This application is based on Japanese Patent Application serial no. 2012-075612 filed with Japan Patent Office on Mar. 29, 2012, and Japanese Patent Application serial no. 2012-090711 filed with Japan Patent Office on Apr. 12, 2012, the entire contents of which are hereby incorporated by reference.

What is claimed is:

1. A semiconductor device comprising:
    an oxide semiconductor layer;
    a first conductive layer partly overlapping with part of the oxide semiconductor layer;
    a second conductive layer partly in contact with other part of the oxide semiconductor layer and partly overlapped by the first conductive layer; and
    a third conductive layer in contact with the second conductive layer,
    wherein, in the oxide semiconductor layer, a concentration of a resistance-reducing element in a first region that is overlapped by the second conductive layer and not overlapped by the third conductive layer is higher than a concentration of the resistance-reducing element in a second region that is overlapped by both of the second conductive layer and the third conductive layer and a third region that is overlapped by the first conductive layer and not overlapped by the second conductive layer, and
    wherein the second region comprises an edge portion of the oxide semiconductor layer.

2. The semiconductor device according to claim 1, wherein the first conductive layer serves as a gate of a transistor.

3. The semiconductor device according to claim 1,
wherein the second conductive layer and the third conductive layer serve as a source or a drain of a transistor.

4. The semiconductor device according to claim 1,
wherein the resistance-reducing element is at least one of carbon (C), phosphorus (P), arsenic (As), antimony (Sb), boron (B), aluminum (Al), nitrogen (N), argon (Ar), helium (He), neon (Ne), indium (In), fluorine (F), chlorine (Cl), titanium (Ti), and zinc (Zn).

5. The semiconductor device according to the claim 1,
wherein the resistance-reducing element is phosphorus (P) or boron (B).

6. The semiconductor device according to the claim 1,
wherein the third conductive layer overlaps with the second conductive layer excluding an edge portion of the second conductive layer.

7. A semiconductor device comprising:
an oxide semiconductor layer having a channel formation region;
a first conductive layer partly overlapping with the channel formation region;
a second conductive layer in contact with the first conductive layer;
a third conductive layer in contact with part of the oxide semiconductor layer and partly overlapped by the first conductive layer; and
a fourth conductive layer in contact with the third conductive layer,
wherein, in the oxide semiconductor layer, a concentration of a resistance-reducing element in a first region that is overlapped by the first conductive layer and not overlapped by the second conductive layer and a concentration of the resistance-reducing element in a second region that is overlapped by the third conductive layer and not overlapped by the fourth conductive layer are higher than a concentration of the resistance-reducing element in the channel formation region and a third region that is overlapped by both of the third conductive layer and the fourth conductive layer, and
wherein the third region comprises an edge portion of the oxide semiconductor layer.

8. The semiconductor device according to claim 7,
wherein the first conductive layer and the second conductive layer serve as a source or a drain of a transistor.

9. The semiconductor device according to the claim 7,
wherein the resistance-reducing element is at least one of carbon (C), phosphorus (P), arsenic (As), antimony (Sb), boron (B), aluminum (Al), nitrogen (N), argon (Ar), helium (He), neon (Ne), indium (In), fluorine (F), chlorine (Cl), titanium (Ti), and zinc (Zn).

10. The semiconductor device according to the claim 7,
wherein the resistance-reducing element is phosphorus (P) or boron (B).

11. The semiconductor device according to the claim 7,
wherein the fourth conductive layer overlaps with the third conductive layer excluding an edge portion of the first conductive layer.

* * * * *